US012604760B2

(12) United States Patent　　　　　(10) Patent No.:　US 12,604,760 B2
Nakano　　　　　　　　　　　　　　　　(45) Date of Patent:　　Apr. 14, 2026

(54) SEMICONDUCTOR MODULE AND METHOD FOR MANUFACTURING SEMICONDUCTOR MODULE

(71) Applicant: FUJI ELECTRIC CO., LTD., Kawasaki (JP)

(72) Inventor: Hayato Nakano, Kofu (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 611 days.

(21) Appl. No.: 17/972,215

(22) Filed: Oct. 24, 2022

(65) Prior Publication Data

US 2023/0178443 A1　　Jun. 8, 2023

(30) Foreign Application Priority Data

Dec. 2, 2021　(JP) ................................. 2021-196297

(51) Int. Cl.
　　*H01L 23/055*　　(2006.01)
　　*H01L 21/56*　　(2006.01)
　　*H01L 23/29*　　(2006.01)
　　*H01L 23/31*　　(2006.01)
(52) U.S. Cl.
　　CPC ............ *H01L 23/055* (2013.01); *H01L 21/56* (2013.01); *H01L 23/293* (2013.01); *H01L 23/3121* (2013.01)
(58) Field of Classification Search
　　CPC ..... H01L 23/055; H01L 21/56; H01L 23/293; H01L 23/3121; H01L 23/053; H01L 21/54; H01L 23/24
　　See application file for complete search history.

(56) References Cited

U.S. PATENT DOCUMENTS

| | | | |
|---|---|---|---|
| 9,966,344 B2 | 5/2018 | Soyano | |
| 10,784,214 B2 | 9/2020 | Soyano et al. | |
| 2016/0338669 A1* | 11/2016 | Naka ................... | B29C 45/0025 |
| 2017/0077044 A1* | 3/2017 | Soyano ................. | H01L 23/047 |
| 2019/0157221 A1 | 5/2019 | Soyano et al. | |

FOREIGN PATENT DOCUMENTS

| | | |
|---|---|---|
| JP | 02-150051 A | 6/1990 |
| JP | 09-186547 A | 7/1997 |
| WO | 2016084622 A1 | 6/2016 |
| WO | 2018142863 A1 | 8/2018 |

* cited by examiner

*Primary Examiner* — Evan G Clinton
*Assistant Examiner* — Corbyn D Mellinger

(57)　　　　　　ABSTRACT

There are provided a semiconductor module capable of preventing the adhesion of an epoxy resin to a terminal to which at least one of a high current and a high voltage is supplied and a method for manufacturing a semiconductor module. A semiconductor module includes: a case having an inner wall defining a casting region and a peripheral edge portion arranged outside the inner wall; an intermediate terminal arranged in along side portion of a peripheral edge portion and having a fastening surface to which a cable is fastened; a structure arranged in a long side portion of the inner wall to be adjacent to the long side portion where the intermediate terminal is arranged and higher than the fastening surface; and a sealing section formed of an epoxy resin, having weld lines formed close to the side of the structure on a surface, and cast into a casting region to seal transistors.

18 Claims, 9 Drawing Sheets

F I G. 9
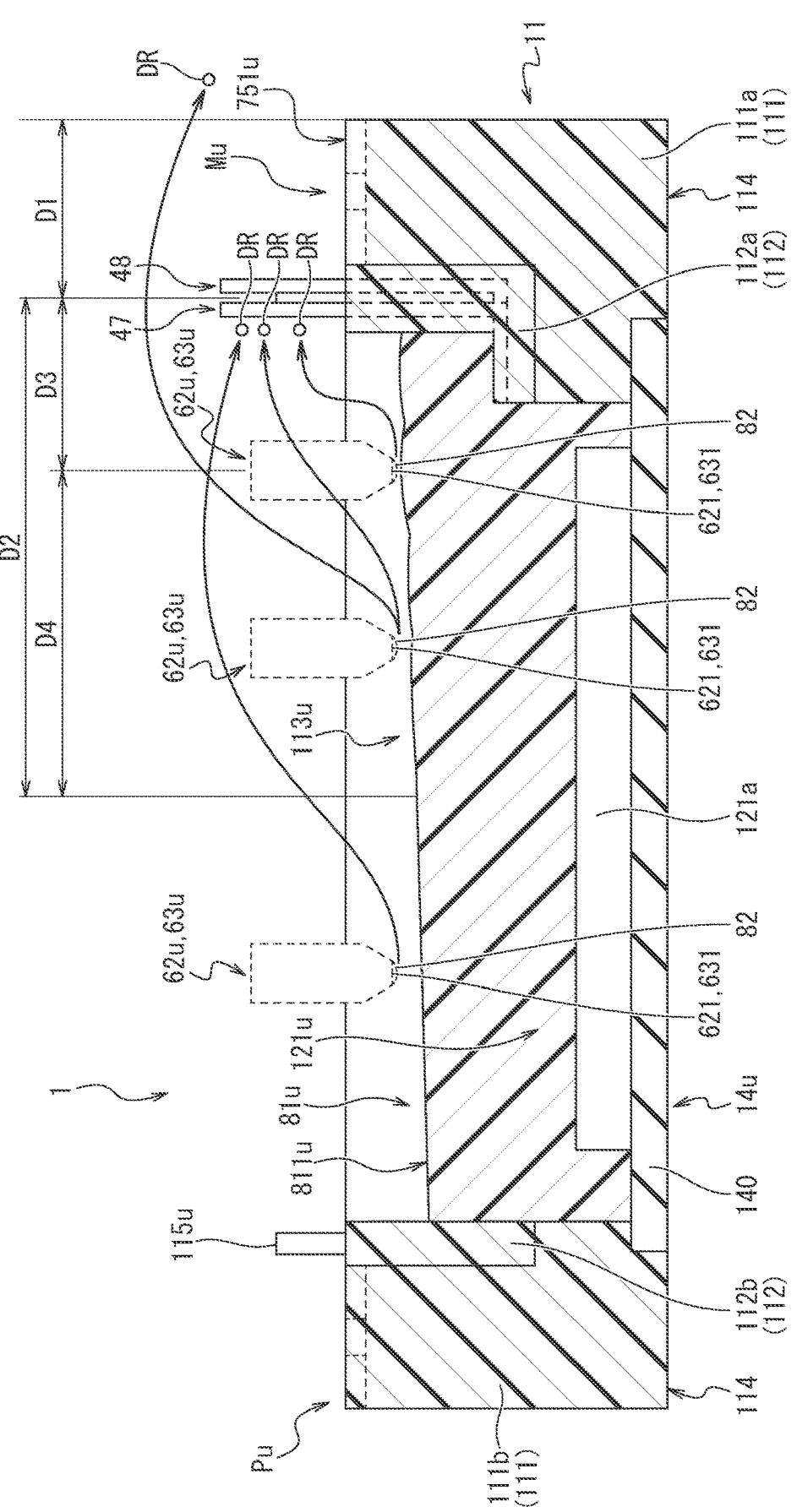

SEMICONDUCTOR MODULE AND METHOD FOR MANUFACTURING SEMICONDUCTOR MODULE

CROSS-REFERENCE TO RELATED APPLICATIONS

This application is based upon and claims the benefit of priority from the prior Japanese Patent Application No. 2021-196297, filed on Dec. 2, 2021, the entire contents of which are incorporated herein by reference.

TECHNICAL FIELD

The present invention relates to a semiconductor module applied to power converters and the like and a method for manufacturing a semiconductor module.

BACKGROUND ART

PTL 1 discloses "To provide a surface mount piezoelectric component free from a risk that droplets of sealing solder adheres to a quartz oscillator in a step of hermetically sealing a container and a lid, the surface mount piezoelectric component contains the container including a recessed portion and the lid, in which a piezoelectric element is hermetically sealed into the recessed portion, and the surface mount piezoelectric component is configured such that a notch is provided in the outer periphery of a position where the container and the lid are sealed, which is the outer peripheral edge in contact with the lid of the container, and the notch is filled with a sealing member".

PTL 2 discloses a semiconductor module including: a base plate; a resin case provided on the base plate; three main terminals attached to the resin case; a plurality of semiconductor chips provided on the base plate in a hollow space of the resin case; and a sealing material injected into the hollow space. PTL 3 discloses a semiconductor module including: a plurality of semiconductor chips; a resin case housing the plurality of semiconductor chips; an input terminal and a three-phase output terminal connected to a main power supply provided on the surface of the resin case; and a resin sealing the plurality of semiconductor chips. PTL 4 discloses a semiconductor module including: a plurality of transistors; a package housing the plurality of transistors; and an input terminal for power supply fixed to the package and an output terminal connected to a motor.

CITATION LIST

Patent Literatures

PTL 1: JP 9-186547 A
PTL 2: WO 16/084622
PTL 3: WO 18/142863
PTL 4: JP 2-150051 A

SUMMARY OF INVENTION

Technical Problem

PTL 1 describes disadvantages that, when the sealing solder is heated and melted in the step of sealing the container and the lid, droplets are generated from the melted solder and adhere to the quartz oscillator, causing characteristic defects, such as a change in the resonance frequency or oscillation stop, so that the manufacturing yield of the surface mount piezoelectric component is lowered. However, PTL 1 does not describe a semiconductor module.

To the main terminals of the semiconductor module disclosed in PTL 2, the input terminal or the three-phase output terminal of the semiconductor module disclosed in PTL 3, and the input terminal or the output terminal of the semiconductor module disclosed in PTL 4, a large current flows or a high voltage is applied, as compared with control terminals connected to control terminals of semiconductor chips or transistors. In conventional semiconductor modules, an epoxy resin forming a sealing material sometimes adheres to such terminals to which a large current flows or a high voltage is applied. The epoxy resin is an insulating material. Therefore, the adhesion of the epoxy resin to the terminals to which a large current flows or a high voltage is applied increases the contact resistance between predetermined cables connected to the terminals and the terminals, so that the terminals generate heat or a desired current does not flow to the terminals or a desired voltage is not applied to the terminals in some cases. Thus, the semiconductor modules have posed problems, such as a reduction in the efficiency for driving a load, such as a motor, and the inability to drive the load.

It is an object of the present invention to provide a semiconductor module and a high voltage is supplied and a method for manufacturing a semiconductor module capable of preventing the adhesion of an epoxy resin to a terminal to which at least one of a high current.

Solution to Problem

To achieve the above-described object, a semiconductor module according to one aspect of the present invention includes: a case having an inner wall defining a space where a plurality of switching elements is arranged and a peripheral edge portion arranged outside the inner wall and formed in a rectangular annular shape; an intermediate terminal arranged in one of a pair of long side portions forming apart of the peripheral edge portion and facing each other, having a fastening surface to which a cable connected to a load as a drive target is fastened, and connected to the plurality of switching elements; a structure arranged in a partial region of the inner wall to be adjacent to the long side portion where the intermediate terminal is arranged and higher than the fastening surface; and a sealing section formed of an epoxy resin, having weld lines formed close to the side of the structure on the surface, and cast into the space to seal the plurality of switching elements.

To achieve the above-described object, a method for manufacturing a semiconductor module according to one aspect of the present invention is a method for manufacturing a semiconductor module, the semiconductor module being the semiconductor module of the present invention described above, and the method includes: arranging a nozzle included in a casting device configured to cast the epoxy resin into the space at a predetermined position in the space from above the case; discharging the epoxy resin from the nozzle into the space while moving the nozzle in a direction toward and away from the one of the pair of long side portions; stopping the movement of the nozzle at a position close to the side of the structure in the space; and stopping the discharge of the epoxy resin into the space and completing the formation of the sealing section.

Advantageous Effects of Invention

One aspect of the present invention can prevent the adhesion of an epoxy resin to terminals to which at least one of a large current and a high voltage is supplied.

BRIEF DESCRIPTION OF DRAWINGS

FIG. 2 is a schematic cross-sectional view cut along the α-α line illustrated in FIG. 1 illustrating a schematic configuration example of a U-phase inverter section provided in the semiconductor module according to one embodiment of the present invention;

FIG. 8 is a view (No. 5) for explaining the method for manufacturing a semiconductor module according to one embodiment of the present invention; and FIG. 9 is a view for explaining the effects of the semiconductor module and the method for manufacturing a semiconductor module according to one embodiment of the present invention.

DESCRIPTION OF EMBODIMENTS

Each embodiment of the present invention exemplifies devices or methods for embodying the technical idea of the present invention. The technical idea of the present invention does not specify materials, shapes, structures, arrangement, and the like of constituent parts to the materials, shapes, structures, arrangement, and the like described below. The technical idea of the present invention can be variously altered within the technical scope specified by claims.

A semiconductor module and a method for manufacturing a semiconductor module according to one embodiment of the present invention are described using FIGS. 1 to 9. First, the schematic configuration of the semiconductor module according to this embodiment is described using FIGS. 1 to 3. In this embodiment, a power conversion module capable of performing DC/AC conversion as a semiconductor module is described as an example.

(Entire Configuration of Semiconductor Module)

Figure 1:
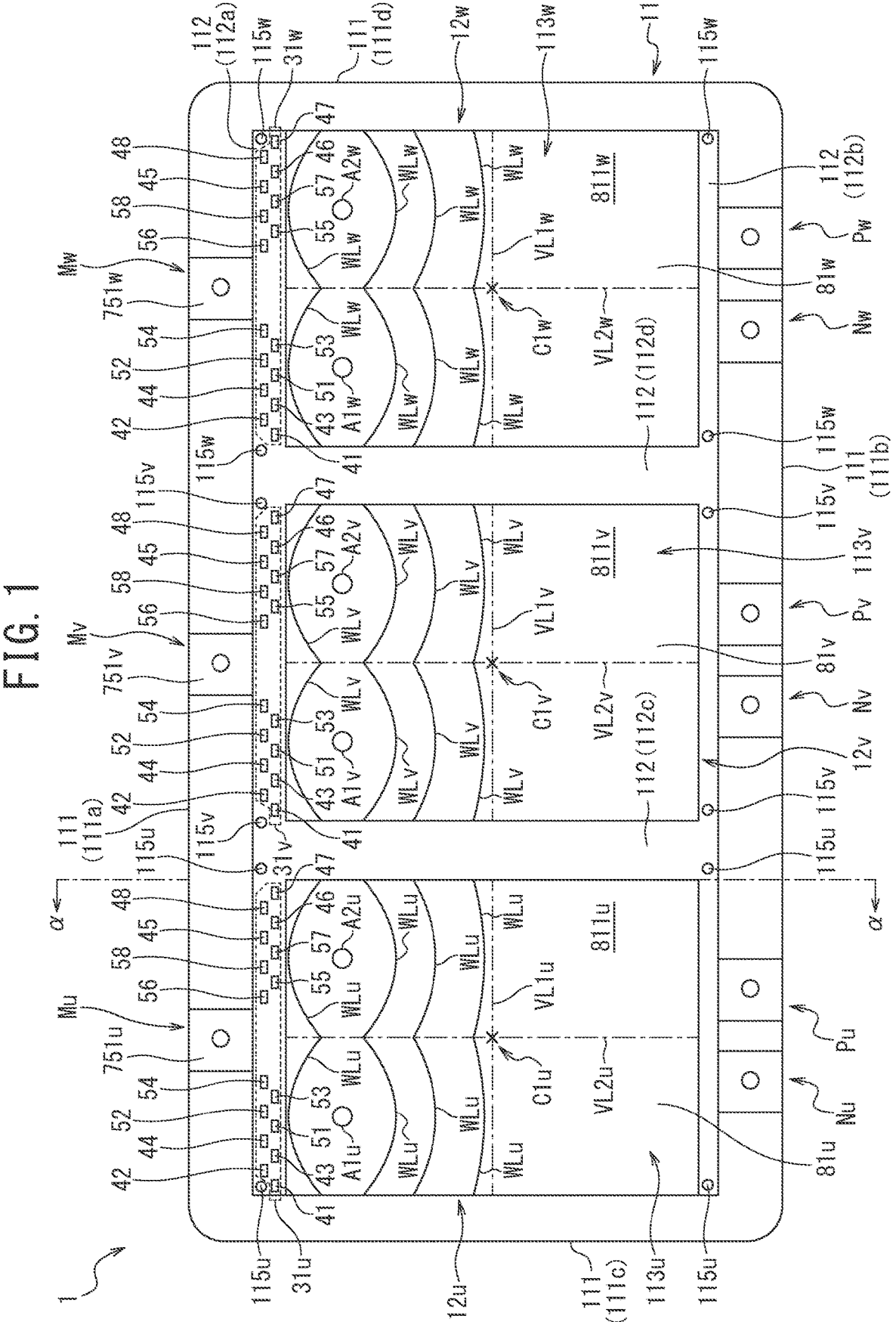
FIG. 1 is a schematic plan view illustrating a schematic configuration example of a semiconductor module according to one embodiment of the present invention.
Figure 2:
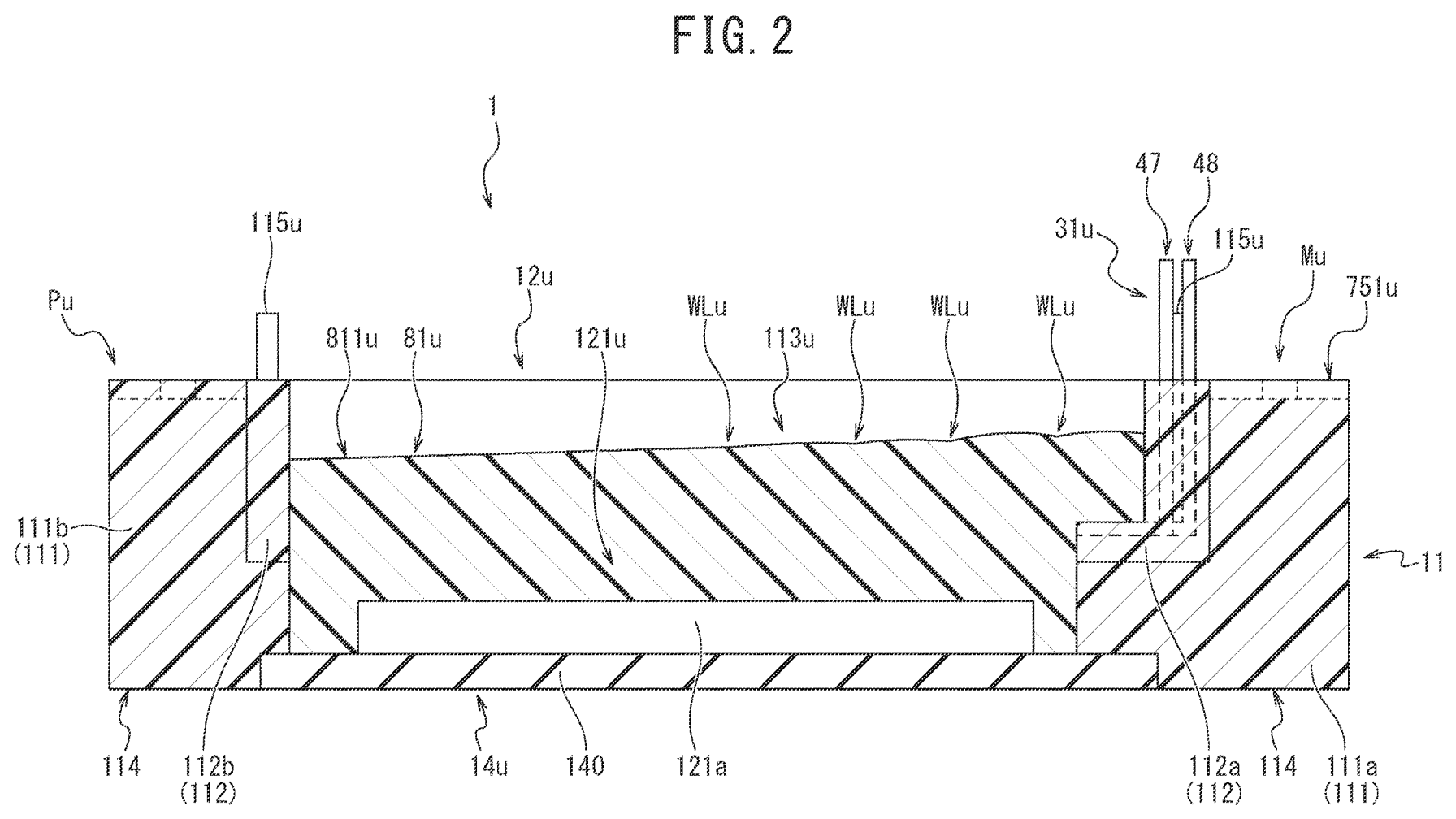
Figure 3:
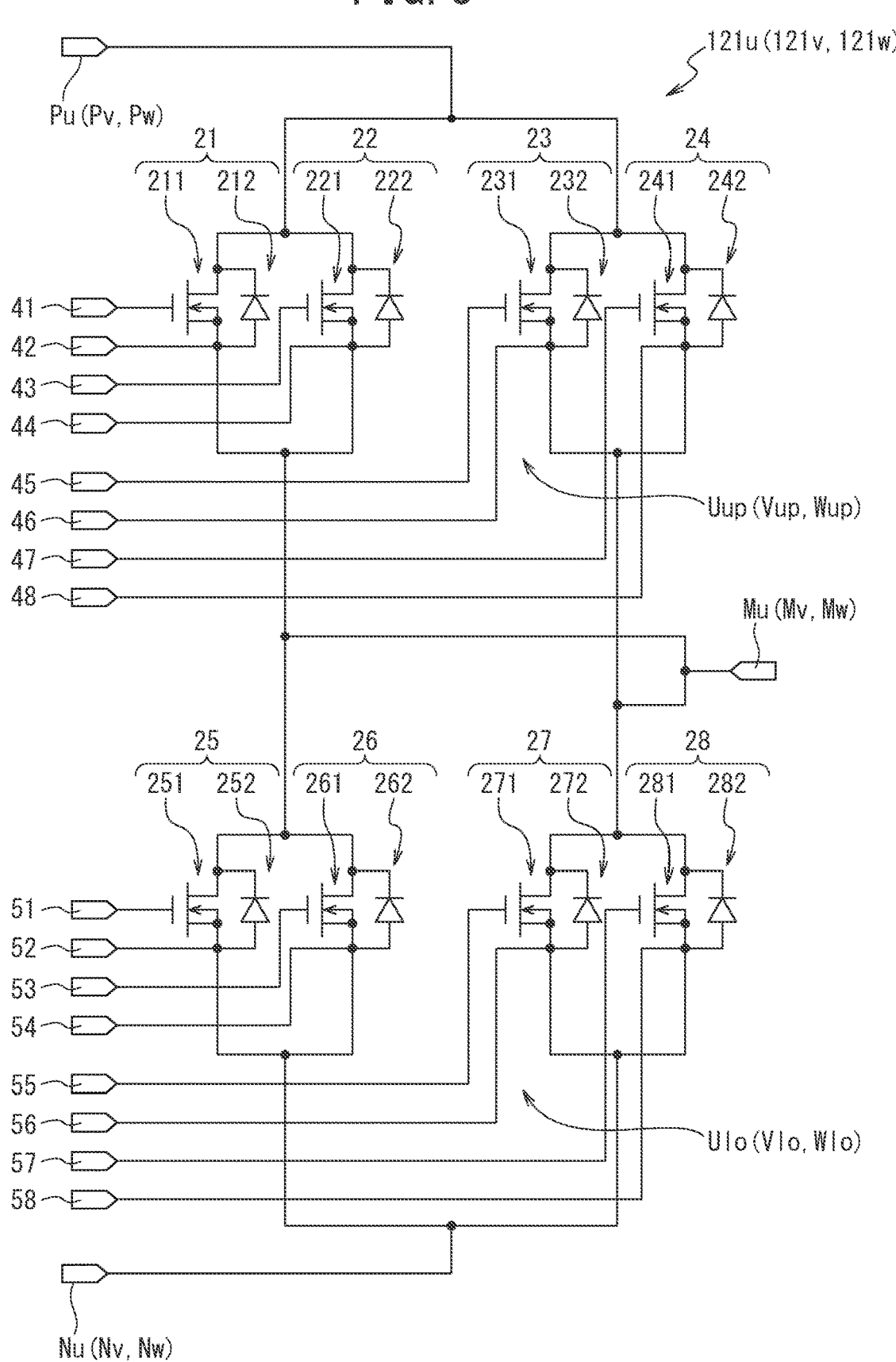
FIG. 3 is a circuit diagram of the U-phase inverter section provided in the semiconductor module according to one embodiment of the present invention.

FIG. 1 is a schematic plan view illustrating a schematic configuration example of a semiconductor module 1 according to this embodiment. For ease of understanding, FIG. 1 illustrates predetermined centers and virtual straight lines that are not originally provided on the surfaces of sealing sections in the semiconductor module 1. FIG. 2 is a schematic cross-sectional view of the semiconductor module 1 cut along the α-α line illustrated in FIG. 1. FIG. 2 illustrates a presence region of an inverter circuit provided in the semiconductor module 1 and does not illustrate transistors and the like constituting the inverter circuit. Further, FIG. 2 does not illustrate bonding wires connecting each main control terminal and the transistors provided in the semiconductor module 1. FIG. 3 is a circuit diagram of an inverter circuit of a U-phase inverter section provided in the semiconductor module 1.

As illustrated in FIG. 1, the semiconductor module 1 according to this embodiment includes a case 11 having an inner wall 112 defining casting regions (an example of the space) 113u, 113v, 113w where a plurality of transistors (an example of the switching elements) 211, 221, 231, 241, 251, 261, 271, 281 (not illustrated in FIG. 1, see FIG. 3) is arranged and a peripheral edge portion 111 arranged outside the inner walls 112 and formed in a rectangular annular shape. Hereinafter, the transistors 211, 221, 231, 241, 251, 261, 271, 281 are sometimes abbreviated as "transistors 211 to 281".

The peripheral edge portion 111 has a pair of long side portions 111a, 111b arranged to face each other and a pair of short side portions 111c, 111d laid between both end portions of the pair of long side portions 111a, 111b. The inner wall 112 has a pair of long side portions 112a, 112b arranged to face each other and partition sections 112c, 112d partitioning a space surrounded by the peripheral edge portion 111 into the casting regions 113u, 113v, 113w. The long side portion 112a is arranged adjacent to the long side portion 111a of the peripheral edge portion 111. The long side portion 112b is arranged adjacent to the long side portion 111b of the peripheral edge portion 111. The partition section 112c partitions the space surrounded by the peripheral edge portion 111 into the casting region 113u and the other region. The partition section 112d partitions the other region into the casting region 113v and the casting region 113w.

Therefore, the casting region 113u is a region surrounded by the short side portion 111c of the peripheral edge portion 111 and the long side portion 112a, the partition section 112c, and the long side portion 112b of the inner wall 112. The casting region 113v is a region surrounded by the partition section 112c, the long side portion 112a, the partition section 112d and the long side portion 112b of the inner wall 112. The casting region 113w is a region surrounded by the partition section 112d and the long side portion 112a of the inner wall 112, the short side portion 111d of the peripheral edge portion 111, and the long side portion 112b of the inner wall 112.

The peripheral edge portion 111 and the inner wall 112 are integrally formed, for example. More specifically, the peripheral edge portion 111 and the inner wall 112, i.e., the case 11, are made of a thermoplastic resin, for example.

The semiconductor module 1 includes an intermediate terminal Mu arranged in the long side portion 111a (an example of the one of long side portions) of the pair of long side portions 111a, 111b forming a part of the peripheral edge portion 111 and facing each other, having a fastening surface 751u to which a cable (not illustrated) connected to a load as a drive target is fastened, and connected to the transistors 211 to 281. The semiconductor module 1 includes a U-phase positive electrode terminal Pu connected to the positive electrode side of DC power. The semiconductor module 1 includes a U-phase negative electrode terminal Nu arranged next to the positive electrode terminal Pu and connected to the negative electrode side of the DC power. The positive electrode terminal Pu and the negative electrode terminal Nu are arranged in the long side portion 111b which is the other one of the pair of long side portions 111a, 111b forming a part of the peripheral edge portion 111 and facing each other. The positive electrode terminal Pu and the negative electrode terminal Nu, and the intermediate terminal Mu are arranged in the peripheral edge portion 111 with the casting region 113u interposed therebetween.

The intermediate terminal Mu, the positive electrode terminal Pu, and the negative electrode terminal Nu are connected to the transistors 211 to 281 arranged in the casting region 113u. The positive electrode terminal Pu and the negative electrode terminal Nu supply DC power to be input to the transistors 211 to 281 arranged in the casting region 113u. The transistors 211 to 281 arranged in the casting region 113u are controlled by a control device (not illustrated) and convert the DC power input from the positive electrode terminal Pu and the negative electrode terminal Nu into U-phase AC power. The U-phase AC power generated by the transistors 211 to 281 arranged in the casting region 113u is output to the outside via the intermediate terminal Mu. Thus, the intermediate terminal Mu serves as an output terminal from which the U-phase AC power is output.

The semiconductor module 1 includes an intermediate terminal My arranged in the long side portion 111a (an example of the one of long side portions) of the pair of long side portions 111a, 111b forming a part of the peripheral edge portion 111 and facing each other, having a fastening surface 751v to which a cable (not illustrated) connected to a load as a drive target is fastened, and connected to the transistors 211 to 281. The semiconductor module 1 includes a V-phase positive electrode terminal Pv connected to the positive electrode side of DC power. The semiconductor module 1 includes a V-phase negative electrode terminal Nv arranged next to the positive electrode terminal Pv and connected to the negative electrode side of the DC power. The positive electrode terminal Pv and the negative electrode terminal Nv are arranged in the long side portion 111b which is the other one of the pair of long side portions 111a, 111b forming a part of the peripheral edge portion 111 and facing each other. The positive electrode terminal Pv and the negative electrode terminal Nv, and the intermediate terminal Mv are arranged in the peripheral edge portion 111 with the casting region 113v interposed therebetween.

The intermediate terminal Mv, the positive electrode terminal Pv, and the negative electrode terminal Nv are connected to the transistors 211 to 281 arranged in the casting region 113v. The positive electrode terminal Pv and the negative electrode terminal Nv supply DC power to be input to the transistors 211 to 281 arranged in the casting region 113v. The transistors 211 to 281 arranged in the casting region 113v are controlled by the control device (not illustrated) and convert the DC power input from the positive electrode terminal Pv and the negative electrode terminal Nv into V-phase AC power. The V-phase AC power generated by the transistors 211 to 281 arranged in the casting region 113v is output to the outside via the intermediate terminal Mv. Thus, the intermediate terminal Mv serves as an output terminal from which the V-phase AC power is output.

The semiconductor module 1 includes an intermediate terminal Mw arranged in the long side portion 111a (an example of the one of long side portions) of the pair of long side portions 111a, 111b forming a part of the peripheral edge portion 111 and facing each other, having a fastening surface 751w to which a cable (not illustrated) connected to a load as a drive target is fastened, and connected to the transistors 211 to 281. The semiconductor module 1 includes a W-phase positive electrode terminal Pw connected to the positive electrode side of DC power. The semiconductor module 1 includes a W-phase negative electrode terminal Nw arranged next to the positive electrode terminal Pw and connected to the negative electrode side of the DC power. The positive electrode terminal Pw and the negative electrode terminal Nw are arranged in the long side portion 111b which is the other one of the pair of long side portions 111a, 111b forming a part of the peripheral edge portion 111 and facing each other. The positive electrode terminal Pw and the negative electrode terminal Nw, and the intermediate terminal Mw are arranged in the peripheral edge portion 111 with the casting region 113w interposed therebetween.

The intermediate terminal Mw, the positive electrode terminal Pw, and the negative electrode terminal Nw are connected to the transistors 211 to 281 arranged in the casting region 113w. The positive electrode terminal Pw and the negative electrode terminal Nw supply DC power to be input to the transistors 211 to 281 arranged in the casting region 113w. The transistors 211 to 281 arranged in the casting region 113w are controlled by a control device (not illustrated) and convert the DC power input from the positive electrode terminal Pw and the negative electrode terminal Nw into W-phase AC power. The W-phase AC power generated by the transistors 211 to 281 arranged in the casting region 113w is output to the outside via the intermediate terminal Mw. Thus, the intermediate terminal Mw serves as an output terminal from which the W-phase AC power is output.

In a portion defining the casting region 113u of the long side portion 112a of the inner wall 112, gate signal output terminals 41, 43, 45, 47, 51, 53, 55, 57 and current detection terminals 42, 44, 46, 48, 52, 54, 56, 58 connected to the transistors 211 to 281 (not illustrated in FIG. 1), respectively, provided in a U-phase inverter section 12u are arranged. Hereinafter, the gate signal output terminals 41, 43, 45, 47, 51, 53, 55, 57 are abbreviated as "gate signal output terminals 41 to 57", and the current detection terminals 42, 44, 46, 48, 52, 54, 56, 58 are abbreviated as "current detection terminals 42 to 58" in some cases.

In a portion defining the casting region 113v of the long side portion 112a of the inner wall 112, the gate signal output terminals 41 to 57 and the current detection terminals 42 to 58 connected to the transistors 211 to 281 (not illustrated in FIG. 1), respectively, provided in a V-phase inverter section 12v are arranged. The gate signal output terminals 41 to 57 and the current detection terminals 42 to 58 provided in the V-phase inverter section 12v have the same structures as those of the gate signal output terminals 41 to 57 and the current detection terminals 42 to 58 provided in the U-phase inverter section 12u.

In a portion defining the casting region 113w of the long side portion 112a of the inner wall 112, the gate signal output terminals 41 to 57 and the current detection terminals 42 to 58 connected to the transistors 211 to 281 (not illustrated in FIG. 1), respectively, provided in a W-phase inverter section 12w are arranged. The gate signal output terminals 41 to 57 and the current detection terminals 42 to 58 provided in the W-phase inverter section 12w have the same structures as those of the gate signal output terminals 41 to 57 and the current detection terminals 42 to 58 provided in the U-phase inverter section 12u.

As illustrated in FIGS. 1 and 2, the semiconductor module 1 includes a structure 31u arranged in the long side portion 112a (an example of the partial region) of the inner wall 112 to be adjacent to the long side portion 111a where the intermediate terminal Mu is arranged and higher than the fastening surface 751u. In this embodiment, the structure 31*u* has the gate signal output terminals 41 to 57 and the current detection terminals 42 to 58 connected to the transistors 211 to 281, respectively, arranged in the casting region 113*u*.

As illustrated in FIG. 2, the gate signal output terminal 47 provided in the U-phase inverter section 12*u* is higher than the fastening surface 751*u* of the intermediate terminal Mu with a surface 114 of the case 11 on the side to which a direct bonded copper (DBC) substrate 14*u* is attached as a reference. Although not illustrated, the gate signal output terminals 41, 43, 45, 51, 53, 55, 57 have the same structure as that of the gate signal output terminal 47, and are provided in the case 11 in the same manner as the gate signal output terminal 47. Therefore, the gate signal output terminals 41, 43, 45, 51, 53, 55, 57 are also higher than the fastening surface 751*u* with the surface 114 of case 11 as a reference.

As illustrated in FIG. 2, the current detection terminal 48 provided in the U-phase inverter section 12*u* is higher than the fastening surface 751*u* of the intermediate terminal Mu with the surface 114 of the case 11 as a reference. Although not illustrated, the current detection terminals 42, 44, 46, 52, 54, 56, 58 have the same structure as that of the current detection terminal 48, and are provided in the case 11 in the same manner as the current detection terminal 48. Therefore, the current detection terminals 42, 44, 46, 52, 54, 56, 58 are also higher than the fastening surface 751*u* with the surface 114 of the case 11 as a reference.

Returning to FIG. 1, the semiconductor module 1 includes a structure 31*v* arranged in the long side portion 112*a* (an example of the partial region) of the inner wall 112 to be adjacent to the long side portion 111*a* where the intermediate terminal My is arranged and higher than the fastening surface 751*v*. In this embodiment, the structure 31*v* has the gate signal output terminals 41 to 57 and the current detection terminals 42 to 58 connected to the transistors 211 to 281, respectively, arranged in the casting region 113*v*.

Although not illustrated, the gate signal output terminals 41 to 57 provided in the V-phase inverter section 12*v* have the same structure as that of the gate signal output terminal 47 provided in the U-phase inverter section 12*u*, and are provided in the case 11 in the same manner as the gate signal output terminal 47 provided in the U-phase inverter section 12*u*. Therefore, the gate signal output terminals 41 to 57 provided in the V-phase inverter section 12*v* are higher than the fastening surface 751*v* of the intermediate terminal My with the surface 114 of the case 11 as a reference.

Although not illustrated, the current detection terminals 42 to 58 provided in the V-phase inverter section 12*v* have the same structure as that of the current detection terminal 48 provided in the U-phase inverter section 12*u*, and are provided in the case 11 in the same manner as the gate signal output terminal 47 provided in the U-phase inverter section 12*u*. Therefore, the current detection terminals 42 to 58 provided in the V-phase inverter section 12*v* are higher than the fastening surface 751*v* of the intermediate terminal My with the surface 114 of the case 11 as a reference.

As illustrated FIG. 1, the semiconductor module 1 includes a structure 31*w* arranged in the long side portion 112*a* (an example of the partial region) of the inner wall 112 to be adjacent to the long side portion 111*a* where the intermediate terminal Mw is arranged and higher than the fastening surface 751*w*. In this embodiment, the structure 31*w* has the gate signal output terminals 41 to 57 and the current detection terminals 42 to 58 connected to the transistors 211 to 281, respectively, arranged in the casting region 113*w*.

Although not illustrated, the gate signal output terminals 41 to 57 provided in the W-phase inverter section 12*w* have the same structure as that of the gate signal output terminal 47 provided in the U-phase inverter section 12*u*, and are provided in the case 11 in the same manner as the gate signal output terminal 47 provided in the U-phase inverter section 12*u*. Therefore, the gate signal output terminals 41 to 57 provided in the W-phase inverter section 12*w* are higher than the fastening surface 751W of the intermediate terminal Mw with the surface 114 of the case 11 as a reference.

Although not illustrated, the current detection terminals 42 to 58 provided in the W-phase inverter section 12*w* have the same structure as that of the current detection terminal 48 provided in the U-phase inverter section 12*u*, and are provided in the case 11 in the same manner as the gate signal output terminal 47 provided in the U-phase inverter section 12*u*. Therefore, the current detection terminals 42 to 58 provided in the W-phase inverter section 12*w* are higher than the fastening surface 751*w* of the intermediate terminal Mw with the surface 114 of the case 11 as a reference.

Therefore, in the semiconductor module 1, the structure 31*u* provided in the U-phase inverter section 12*u* is higher than the fastening surface 751*u*, the structure 31*v* provided in the V-phase inverter section 12*v* is higher than the fastening surface 751*v*, and the structure 31*w* provided in the W-phase inverter section 12*w* is higher than the fastening surface 751*w*.

As illustrated in FIGS. 1 and 2, the semiconductor module 1 includes a sealing section 81*u* made of an epoxy resin, having weld lines WLu formed close to the side of the structure 31*u* on a surface 811*u*, and cast into the casting region 113*u* to seal the transistors 211 to 281.

As viewed in a direction intersecting the surface 811*u* of the sealing section 81*u* (i.e., in a plan view), the weld lines WLu formed in the sealing section 81*u* are formed in a region of the surface 811*u* of the sealing section 81*u* included between a virtual straight line VL1*u* including a center C1*u* in a direction in which the pair of long side portions 111*a*, 111*b* of the peripheral edge portion 111 constituting the case 11 are arranged and intersecting the direction and the long side portion 112*a* of the inner wall 112.

As viewed in the direction intersecting the surface 811*u* of the sealing section 81*u*, at least parts of the weld lines WLu formed in the sealing section 81*u* have a linearly symmetrical shape with a virtual straight line VL2*u* including the center C1*u* and parallel to the direction in which the pair of long side portions 111*a*, 111*b* are arranged as the axis.

As viewed in the direction intersecting the surface 811*u* of the sealing section 81*u*, at least parts of the weld lines WLu formed in the sealing section 81*u* have a shape spreading in a circular shape with a region A1*u* (an example of the predetermined region) of the surface 811*u* positioned in front of the structure 31*u* as the center. As viewed in the direction intersecting the surface 811*u* of the sealing section 81*u*, at least parts of the weld lines WLu formed in the sealing section 81*u* have a shape spreading in a circular shape with a region A2*u* (an example of the predetermined region) of the surface 811*u* positioned in front of the structure 31*u* as the center.

Although details are described later, in the semiconductor module 1, epoxy resins are discharged into the casting region 113*u* from two nozzles to form the sealing section 81*u*. The regions A1*u*, A2*u* correspond to the positions where these two nozzles finally stop. The weld lines WLu are generated by the flow of the epoxy resins discharged at the final stop positions of the two nozzles in the casting region 113*u*.

As illustrated in FIG. 2, the long side portion 111*a* of the peripheral edge portion 111 and the long side portion 112*a* of the inner wall 112 have a step shape in which the DBC substrate 14*u* side projects toward the casting region 113*u* relative to the fastening surface 751*u* side of the intermediate terminal Mu. In this step portion, end portions of the gate signal output terminals 41 to 57 and the current detection terminals 42 to 58, which are bent in an L shape, are arranged to be exposed into the casting region 113*u*. To the end portions, bonding wires (not illustrated) are connected, the bonding wires connecting the transistors 211 to 281 (not illustrated in FIG. 2, see FIG. 3) arranged in a presence region 121*a* of an inverter circuit 121*u*, and the gate signal output terminals 41 to 57 and the current detection terminal 42 to 58. Therefore, when the transistors 211 to 281, the bonding wires, and the like arranged in the casting region 113*u* are regarded as one constituent component group, the constituent component group is entirely relatively higher in the long side portion 112*a* side than in the long side portion 112*b* side of the inner wall 112. Therefore, the sealing section 81*u* is formed such that the thickness of the long side portion 112*a* side of the inner wall 112 is larger than the thickness of the long side portion 112*b* side of the inner wall 112, so that the entire constituent component group can be reliably sealed.

Although details are described later, the epoxy resins sometimes remain at the tips of the nozzles after the completion of the discharge of the epoxy resins into the casting regions 113*u*, 113*v*, 113*w* in the manufacture of the semiconductor module 1. Before retracting the nozzles from the semiconductor module 1, bubbles generated in the epoxy resins remaining at the tips of the nozzles are broken, so that droplets of the epoxy resins are scattered in some cases. However, in the vicinity of the positions where the nozzles stop, the structure 31*u* is arranged which has the gate signal output terminals 41 to 57 and the current detection terminals 42 to 58 and which is higher than the fastening surface 751*u* of the intermediate terminal Mu. This enables the semiconductor module 1 to shield the fastening surface 751*u* of the intermediate terminal Mu from the droplets from the epoxy resins remaining at the tips of the nozzles with the structure 31*u* and prevent the adhesion of the droplets to the fastening surface 751*u* of the intermediate terminal Mu.

Returning to FIG. 1, the semiconductor module 1 includes a sealing section 81*v* made of an epoxy resin, having weld lines WLv formed close to the side of the structure 31*v* on a surface 811*v*, and cast into the casting region 113*v* to seal the transistors 211 to 281.

As viewed in a direction intersecting the surface 811*v* of the sealing section 81*v* (i.e., in a plan view), the weld lines WLv formed in the sealing section 81*v* are formed in a region of the surface 811*v* of the sealing section 81*v* included between a virtual straight line VL1*v* including a center C1*v* in the direction in which the pair of long side portions 111*a*, 111*b* of the peripheral edge portion 111 constituting the case 11 are arranged and intersecting the direction and the long side portion 112*a* of the inner wall 112.

As viewed in the direction intersecting the surface 811*v* of the sealing section 81*v*, at least parts of the weld lines WLv formed in the sealing section 81*v* have a linearly symmetrical shape with a virtual straight line VL2*v* including the center C1*v* and parallel to the direction in which the pair of long side portions 111*a*, 111*b* are arranged as the axis.

As viewed in the direction intersecting the surface 811*v* of the sealing section 81*v*, at least parts of the weld lines WLv formed in the sealing section 81*v* have a shape spreading in a circular shape with a region A1*v* (an example of the predetermined region) of the surface 811*v* positioned in front of the structure 31*v* as the center. As viewed in the direction intersecting the surface 811*v* of the sealing section 81*v*, at least parts of the weld lines WLv formed in the sealing section 81*v* have a shape spreading in a circular shape with a region A2*v* (an example of the predetermined region) of the surface 811*v* positioned in front of the structure 31*v* as the center.

The intermediate terminal My is provided in the case 11 such that the fastening surface 751*v* is substantially flush with the fastening surface 751*u* of the intermediate terminal Mu. The gate signal output terminals 41 to 57 and the current detection terminals 42 to 58 of the V-phase inverter section 12*v* are provided in the case 11 in substantially the same manner as the gate signal output terminals 41 to 57 and the current detection terminals 42 to 58 of the U-phase inverter section 12*u*. The relative positions of the regions A1*v*, A2*v* with respect to the casting region 113*v* are substantially the same as the relative positions of the regions A1*u*, A2*u* with respect to the casting region 113*u*. The regions A1*v*, A2*v* correspond to the final stop positions of two nozzles discharging epoxy resins for forming the sealing section 81*v* in the casting region 113*v*. This enables the semiconductor module 1 to shield the fastening surface 751*v* of the intermediate terminal Mv from droplets from the epoxy resins remaining at the tips of the nozzles after the completion of the discharge of the epoxy resins into the casting region 113*v* with the structure 31*v* and prevent the adhesion of the droplets to the fastening surface 751*v* of the intermediate terminal Mv.

As illustrated in FIG. 1, the semiconductor module 1 includes a sealing section 81*w* made of an epoxy resin, having weld lines WLw formed close to the side of the structure 31*w* on a surface 811*w*, and cast into the casting region 113*w* to seal the transistors 211 to 281 (not illustrated in FIG. 1, see FIG. 3).

As viewed in a direction intersecting the surface 811*w* of the sealing section 81*w* (i.e., in a plan view), the weld lines WLw formed in the sealing section 81*w* are formed in a region of the surface 811*w* of the sealing section 81*w* included between a virtual straight line VL1*w* including a center C1*w* in the direction in which the pair of long side portions 111*a*, 111*b* of the peripheral edge portion 111 constituting the case 11 are arranged and intersecting the direction and the long side portion 112*a* of the inner wall 112.

As viewed in the direction intersecting the surface 811*w* of the sealing section 81*w*, at least parts of the weld lines WLw formed in the sealing section 81*w* have a linearly symmetrical shape with a virtual straight line VL2*w* including the center C1*w* and parallel to the direction in which the pair of long side portions 111*a*, 111*b* are arranged as the axis.

As viewed in the direction intersecting the surface 811*w* of the sealing section 81*w*, at least parts of the weld lines WLw formed in the sealing section 81*w* have a shape spreading in a circular shape with a region A1*w* (an example of the predetermined region) of the surface 811*w* positioned in front of the structure 31*w* as the center. As viewed in the direction intersecting the surface 811*w* of the sealing section 81*w*, at least parts of the weld lines WLw formed in the sealing section 81*w* have a shape spreading in a circular shape with a region A2w (an example of the predetermined region) of the surface 811w positioned in front of the structure 31w as the center.

The intermediate terminal Mw is provided in the case 11 such that the fastening surface 751w is substantially flush with the fastening surface 751u of the intermediate terminal Mu. The gate signal output terminals 41 to 57 and the current detection terminals 42 to 58 of the W-phase inverter section 12w are provided in the case 11 in substantially the same manner as the gate signal output terminals 41 to 57 and the current detection terminals 42 to 58 of the W-phase inverter section 12w. The relative positions of the regions A1w, A2w with respect to the casting region 113w are substantially the same as the relative positions of the regions A1u, A2u with respect to the casting region 113u. The regions A1w, A2w correspond to the final stop positions of two nozzles discharging epoxy resins for forming the sealing section 81w into the casting region 113w. This enables the semiconductor module 1 to shield the fastening surface 751w of the intermediate terminal Mw from droplets from the epoxy resins remaining at the tips of the nozzles after the completion of the discharge of the epoxy resins into the casting region 113w with the structure 31w and prevent the adhesion of the droplets to the fastening surface 751w of the intermediate terminal Mw.

The weld lines WLu, WLv, WLw are formed by the flow of the epoxy resins discharged into the casting regions 113u, 113v, 113w to form the sealing sections 81u, 81v, 81w, respectively. Therefore, the weld lines WLu, WLv, WLw do not always have exactly the same shape. However, the weld lines WLu, WLv, WLw each have the shapes of the above-described characteristics, and have at least similar shapes to each other.

The case 11 has a fixation section 115u formed at each of the four corners of the casting region 113u, a fixation section 115v formed at each of the four corners of the casting region 113v, and a fixation section 115w formed at each of the four corners of the casting region 113w. Two fixation sections of the fixation sections 115u, 115v, 115w are arranged in each of the long side portions 112a, 112b of the inner wall 112. The fixation sections 115u, 115v, 115w are formed to be higher than the peripheral edge portion 111 of the case 11 with a surface 114 (not illustrated in FIG. 1, see FIG. 2) of the case 11 as a reference. The peripheral edge portion 111, the inner wall 112, and the fixation sections 115u, 115v, 115w are integrally formed. Therefore, the fixation sections 115u, 115v, 115w are also made of a thermoplastic resin, for example.

The four fixation sections 115u are provided to fix a circuit board (not illustrated) mounted with the control device (not illustrated) for controlling the inverter circuit 121u (not illustrated in FIG. 1, see FIG. 3) provided in the U-phase inverter section 12u. The four fixation sections 115v are provided to fix a circuit board (not illustrated) mounted with the control device (not illustrated) for controlling an inverter circuit 121v (not illustrated in FIG. 1, see FIG. 3) provided in the V-phase inverter section 12v. The four fixation sections 115w are provided to fix a circuit board (not illustrated) mounted with the control device (not illustrated) for controlling an inverter circuit 121w (not illustrated in FIG. 1, see FIG. 3) provided in the W-phase inverter section 12w.

Although details are described later, the transistor 211, the transistor 221, the transistor 231, and the transistor 241 provided in the U-phase inverter section 12u are connected in parallel, and the transistor 251, the transistor 261, the transistor 271, and the transistor 281 are connected in parallel. The transistors 211, 221, 231, 241 connected in parallel and the transistors 251, 261, 271, 281 connected in parallel are connected in series between the positive electrode terminal Pu and the negative electrode terminal Nu in the U-phase inverter section 12u. In the U-phase inverter section 12u, connection portions where the transistors 211 to 281 are connected to each other are connected to the intermediate terminal Mu from which the U-phase AC power is output. More specifically, the transistors 211, 221, 231, 241 each provided in the U-phase inverter section 12u form a part of constituent components constituting an upper arm Uup (not illustrated in FIG. 1, see FIG. 3) of the U-phase AC power. The transistors 251, 261, 271, 281 each provided in the U-phase inverter section 12u form a part of constituent components constituting a lower arm Ulo (not illustrated in FIG. 1, see FIG. 3) of the U-phase AC power.

The transistors 211 to 281 provided in the V-phase inverter section 12v are connected between the positive electrode terminal Pv and the negative electrode terminal Nv in the same manner as the connection state of the transistors 211 to 281 provided in the U-phase inverter section 12u between the positive electrode terminal Pu and the negative electrode terminal Nu. Therefore, the transistors 211, 221, 231, 241 each provided in the V-phase inverter section 12v form a part of constituent components constituting an upper arm Vup (not illustrated in FIG. 1, see FIG. 3) of the V-phase AC power. The transistors 251, 261, 271, 281 each provided in the V-phase inverter section 12v form a part of constituent components constituting a lower arm Vlo (not illustrated in FIG. 1, see FIG. 3) of the V-phase AC power.

The transistors 211 to 281 provided in the W-phase inverter section 12w are connected between the positive electrode terminal Pw and the negative electrode terminal Nw in the same manner as the connection state of the transistors 211 to 281 provided in the U-phase inverter section 12u between the positive electrode terminal Pu and the negative electrode terminal Nu. Therefore, the transistors 211, 221, 231, 241 each provided in the W-phase inverter section 12w form a part of constituent components constituting an upper arm Wup (not illustrated in FIG. 1, see FIG. 3) of the W-phase AC power. The transistors 251, 261, 271, 281 each provided in the W-phase inverter section 12w form a part of constituent components constituting a lower arm Wlo (not illustrated in FIG. 1, see FIG. 3) of the W-phase AC power.

(Configuration of Inverter Circuit)

Next, the schematic configurations of the U-phase inverter section 12u, the V-phase inverter section 12v, and the W-phase inverter section 12w provided in the semiconductor module 1 are described using FIG. 3 referring to FIGS. 1 and 2. The U-phase inverter section 12u, the V-phase inverter section 12v, and the W-phase inverter section 12w have the same configuration. Therefore, the schematic configurations of the U-phase inverter section 12u, the V-phase inverter section 12v, and the W-phase inverter section 12w are described taking the U-phase inverter section 12u as an example.

As illustrated in FIG. 2, the U-phase inverter section 12u has the DBC substrate 14u and the inverter circuit 121u formed on the DBC substrate 14u. In FIG. 2, the illustration of the specific configuration of the inverter circuit 121u is omitted and the inverter circuit 121u is illustrated as the presence region 121a present on the DBC substrate 14u. The DBC substrate 14u has an insulating substrate 140 having substantially the same area as that of an opening of the casting region 113u and formed in a rectangular flat plate shape. The DBC substrate 14u has a plurality of wiring patterns (not illustrated) having a predetermined shape made of a conductive material (for example, copper) on the insulating substrate 140 on the side sealed by the sealing section 81*u*. The DBC substrate 14*u* has a rectangular flat plate-shaped heat transfer pattern (not illustrated) formed on the insulating substrate 140 on the back surface side on the side sealed by the sealing section 81*u*. The DBC substrate 14*u* is attached to the case 11 by an adhesive (not illustrated).

To the plurality of wiring patterns, semiconductor elements 21, 22, 23, 24, 25, 26, 27 (not illustrated in FIG. 2, see FIG. 3) having the transistors 211 to 281 are mounted and the intermediate terminal Mu, the positive electrode terminal Pu, and the negative electrode terminal Nu are electrically and mechanically connected. Hereinafter, the semiconductor elements 21, 22, 23, 24, 25, 26, 27 are sometimes abbreviated as "semiconductor elements 21 to 27".

The semiconductor module 1 has a cooling unit (not illustrated) provided on the surface 114 side of the case 11 and attached to the case 11 in a state where the cooling unit contacts the heat transfer pattern. The cooling unit is mechanically fixed to the case 11 by an adhesive, for example. The DBC substrate 14*u* is soldered, for example, to the cooling unit. This enables the semiconductor module 1 to release the heat generated from the transistors 211 to 281 provided on the DBC substrate 14*u* to the outside via the cooling unit.

Herein, the connection relationships among the positive electrode terminal Pu, the negative electrode terminal Nu, the intermediate terminal Mu, the transistors 211 to 281, and the like provided in the semiconductor module 1 are described using the circuit diagram of the inverter circuit 121*u* illustrated in FIG. 3. FIG. 3 illustrates not only the reference numerals of the positive electrode terminal Pu, the negative electrode terminal Nu, the intermediate terminal Mu, the inverter circuit 121*u*, the upper arm Uup, and the lower arm Ulo for the U-phase but the reference numerals of the positive electrode terminals Pv, Pw, the negative electrode terminals Nv, Nw, the intermediate terminals Mv, Mw, the inverter circuits 121*v*, 121*w*, the upper arms Vup, Wup, and the lower arms Vlo, Wlo for the V-phase and the W-phase, respectively.

As illustrated in FIG. 3, the semiconductor module 1 includes the transistors 211, 221, 231, 241 and freewheel diodes 212, 222, 232, 242. The semiconductor module 1 includes the transistors 251, 261, 271, 281 and freewheel diodes 252, 262, 272, 282.

The transistors 211 to 281 are configured by an N-type metal-oxide-semiconductor field-effect transistor (MOSFET), for example. The freewheel diode 212 is connected to the transistor 211 in anti-parallel. A drain of the transistor 211 and a cathode of the freewheel diode 212 are connected, and a source of the transistor 211 and an anode of the freewheel diode 212 are connected. The transistor 211 and the freewheel diode 212 constitute the semiconductor element 21. In the semiconductor element 21, the transistor 211 and the freewheel diode 212 may be formed on different semiconductor substrates and the transistor 211 and the freewheel diode 212 may be formed on the same semiconductor substrate and integrated into one chip.

The freewheel diode 222 is connected to the transistor 221 in anti-parallel. A drain of the transistor 221 and a cathode of the freewheel diode 222 are connected, and a source of the transistor 221 and an anode of the freewheel diode 222 are connected. The transistor 221 and the freewheel diode 222 constitute the semiconductor element 22. In the semiconductor element 22, the transistor 221 and the freewheel diode 222 may be formed on different semiconductor substrates and the transistor 221 and the freewheel diode 222 may be formed on the same semiconductor substrate and integrated into one chip.

A drain of the transistor 211, a cathode of the freewheel diode 212, a drain of the transistor 221, and a cathode of the freewheel diode 222 are connected to each other. The drain of the transistor 211, the cathode of the freewheel diode 212, the drain of the transistor 221, and the cathode of the freewheel diode 222 are electrically connected to the positive electrode terminal Pu.

The source of the transistor 211 and the anode of the freewheel diode 212 are electrically connected. The source of the transistor 221 and the anode of the freewheel diode 222 are electrically connected. The source of the transistor 211, the anode of the freewheel diode 212, the source of the transistor 221, and the anode of the freewheel diode 222 are connected to each other. The source of the transistor 211, the anode of the freewheel diode 212, the source of the transistor 221, and the anode of the freewheel diode 222 are electrically connected to the intermediate terminal Mu.

The freewheel diode 232 is connected to the transistor 231 in anti-parallel. The transistor 231 and the freewheel diode 232 constitute the semiconductor element 23. In the semiconductor element 23, the transistor 231 and the freewheel diode 232 may be formed on different semiconductor substrates and the transistor 231 and the freewheel diode 232 may be formed on the same semiconductor substrate and integrated into one chip.

The freewheel diode 242 is connected to the transistor 241 in anti-parallel. The transistor 241 and the freewheel diode 242 constitute the semiconductor element 24. In the semiconductor element 24, the transistor 241 and the freewheel diode 242 may be formed on different semiconductor substrates (not illustrated) and the transistor 241 and the freewheel diode 242 may be formed on the same semiconductor substrate and integrated into one chip.

A drain of the transistor 231, a cathode of the freewheel diode 232, a drain of the transistor 241, and a cathode of the freewheel diode 242 are connected to each other. The drain of the transistor 231, the cathode of the freewheel diode 232, the drain of the transistor 241, and the cathode of the freewheel diode 242 are electrically connected to the drain of the transistor 211, the cathode of the freewheel diode 212, the drain of the transistor 221, the cathode of the freewheel diode 222, and the positive electrode terminal Pu.

A source of the transistor 231 and an anode of the freewheel diode 232 are electrically connected. A source of the transistor 241 and the anode of the freewheel diode 222 are electrically connected. The source of the transistor 231, the anode of the freewheel diode 232, the source of the transistor 241, and the anode of the freewheel diode 242 are connected to each other. The source of the transistor 231, the anode of the freewheel diode 232, the source of the transistor 241, and the anode of the freewheel diode 242 are electrically connected to the source of the transistor 211, the anode of the freewheel diode 212, the source of the transistor 221, the anode of the freewheel diode 222, and the intermediate terminal Mu.

Thus, the transistor 211, the freewheel diode 212, the transistor 221, the freewheel diode 222, the transistor 231, the freewheel diode 232, the transistor 241, and the freewheel diode 242 are connected in parallel between the positive electrode terminal Pu and the intermediate terminal Mu. Therefore, the semiconductor elements 21, 22, 23, 24 are connected in parallel between the positive electrode terminal Pu and the intermediate terminal Mu to form the upper arm Uup.

The freewheel diode 252 is connected to the transistor 251 in anti-parallel. The transistor 251 and the freewheel diode 252 constitute the semiconductor element 25. In the semiconductor element 25, the transistor 251 and the freewheel diode 252 may be formed on different semiconductor substrates and the transistor 251 and the freewheel diode 252 may be formed on the same semiconductor substrate and integrated into one chip.

The freewheel diode 262 is connected to the transistor 261 in anti-parallel. The transistor 261 and the freewheel diode 262 constitute the semiconductor element 26. In the semiconductor element 26, the transistor 261 and the freewheel diode 262 may be formed on different semiconductor substrates and the transistor 261 and the freewheel diode 262 may be formed on the same semiconductor substrate and integrated into one chip.

A drain of the transistor 251, a cathode of the freewheel diode 252, a drain of the transistor 261, and a cathode of the freewheel diode 262 are connected to each other. The drain of the transistor 251, the cathode of the freewheel diode 252, the drain of the transistor 261, and the cathode of the freewheel diode 262 are electrically connected to the drain of the transistor 211, the cathode of the freewheel diode 212, the drain of the transistor 221, the cathode of the freewheel diode 222, and the intermediate terminal Mu.

A source of the transistor 251 and an anode of the freewheel diode 252 are electrically connected. A source of the transistor 261 and an anode of the freewheel diode 262 are electrically connected. The source of the transistor 251, the anode of the freewheel diode 252, the source of the transistor 261, and the anode of the freewheel diode 262 are connected to each other. The source of the transistor 251, the anode of the freewheel diode 252, the source of the transistor 261, and the anode of the freewheel diode 262 are electrically connected to the negative electrode terminal Nu.

The freewheel diode 272 is connected to the transistor 271 in anti-parallel. The transistor 271 and the freewheel diode 272 constitute the semiconductor element 27. In the semiconductor element 27, the transistor 271 and the freewheel diode 272 may be formed on different semiconductor substrates and the transistor 271 and the freewheel diode 272 may be formed on the same semiconductor substrate and integrated into one chip.

The freewheel diode 282 is connected to the transistor 281 in anti-parallel. The transistor 281 and the freewheel diode 282 constitute the semiconductor element 28. In the semiconductor element 28, the transistor 281 and the freewheel diode 282 may be formed on different semiconductor substrates and the transistor 281 and the freewheel diode 282 may be formed on the same semiconductor substrate and integrated into one chip.

A drain of the transistor 271, a cathode of the freewheel diode 272, a drain of the transistor 281, and a cathode of the freewheel diode 282 are connected to each other. The drain of the transistor 271, the cathode of the freewheel diode 272, the drain of the transistor 281, and the cathode of the freewheel diode 282 are connected to the drain of the transistor 251, the cathode of the freewheel diode 252, the drain of the transistor 261, the cathode of the freewheel diode 262, and the intermediate terminal Mu.

A source of the transistor 271 and an anode of the freewheel diode 272 are electrically connected. A source of the transistor 281 and an anode of the freewheel diode 282 are electrically connected. The source of the transistor 271, the anode of the freewheel diode 272, the source of the transistor 281, and the anode of the freewheel diode 282 are connected to each other. The source of the transistor 271, the anode of the freewheel diode 272, the source of the transistor 281, and the anode of the freewheel diode 282 are electrically connected to the source of the transistor 251, the anode of the freewheel diode 252, the source of the transistor 261, the anode of the freewheel diode 262, and the negative electrode terminal Nu.

The transistor 251, the freewheel diode 252, the transistor 261, the freewheel diode 262, the transistor 271, the freewheel diode 272, the transistor 281, and the freewheel diode 282 are connected in parallel between the intermediate terminal Mu and the negative electrode terminal Nu. Therefore, the semiconductor elements 25, 26, 27, 28 are connected in parallel between the intermediate terminal Mu and the negative electrode terminal Nu to form the lower arm Ulo.

When the connection relationships among the semiconductor elements 21, 22, 23, 24, 25, 26, 27, 28, the positive electrode terminal Pu, the negative electrode terminal Nu, and the intermediate terminal Mu are structurally viewed, the semiconductor elements 21, 22 connected in parallel and the semiconductor elements 25, 26 connected in parallel are connected in series between the positive electrode terminal Pu and the negative electrode terminal Nu. The semiconductor elements 23, 24 connected in parallel and the semiconductor elements 27, 28 connected in parallel are connected in series between the positive electrode terminal Pu and the negative electrode terminal Nu. The semiconductor elements 21, 22, 25, 26 connected in series between the positive electrode terminal Pu and the negative electrode terminal Nu and the semiconductor elements 23, 24, 27, 28 connected in series between the positive electrode terminal Pu and the negative electrode terminal Nu are connected by the intermediate terminal Mu.

Therefore, when the connection relationships among the semiconductor elements 21, 22, 23, 24, 25, 26, 27, 28, the positive electrode terminal Pu, the negative electrode terminal Nu, and the intermediate terminal Mu are electrically viewed, the semiconductor elements 21, 22, 23, 24 connected in parallel and the semiconductor elements 25, 26, 27, 28 connected in parallel are connected in series between the positive electrode terminal Pu and the negative electrode terminal Nu. In the semiconductor elements 21, 22, 23, 24 connected in parallel and the semiconductor elements 25, 26, 27, 28 connected in parallel, the intermediate terminal Mu is connected to the connection portion between the positive electrode terminal Pu and the negative electrode terminal Nu.

A gate of the transistor 211 is connected to the gate signal output terminal 41. By the connection between the gate of the transistor 211 and the gate signal output terminal 41, a gate signal output from the control device is input into the gate of the transistor 211 via the gate signal output terminal 41.

A source (auxiliary source) of a current detecting transistor (not illustrated) provided in the transistor 211 is connected to the current detection terminal 42. By the connection between the source of the current detecting transistor and the current detection terminal 42, a current flowing from the source of the current detecting transistor is input into the control device.

A gate of the transistor 221 is connected to the gate signal output terminal 43. By the connection between the gate of the transistor 221 and the gate signal output terminal 43, a gate signal output from the control device is input into the gate of the transistor 221 via the gate signal output terminal 43.

A source (auxiliary source) of a current detecting transistor (not illustrated) provided in the transistor 221 is connected to the current detection terminal 44. By the connection between the source of the current detecting transistor and the current detection terminal 44, a current flowing from the source of the current detecting transistor is input into the control device.

A gate of the transistor 231 is connected to the gate signal output terminal 45. By the connection between the gate of the transistor 231 and the gate signal output terminal 45, a gate signal output from the control device is input into the gate of the transistor 231 via the gate signal output terminal 45.

A source (auxiliary source) of a current detecting transistor (not illustrated) provided in the transistor 231 is connected to the current detection terminal 46. By the connection between the source of the current detecting transistor and the current detection terminal 46, a current flowing from the source of the current detecting transistor is input into the control device.

A gate of the transistor 241 is connected to the gate signal output terminal 47. By the connection between the gate of the transistor 241 and the gate signal output terminal 47, a gate signal output from the control device is input into the gate of the transistor 241 via the gate signal output terminal 47.

A source (auxiliary source) of a current detecting transistor (not illustrated) provided in the transistor 241 is connected to the current detection terminal 48. By the connection between the source of the current detecting transistor and the current detection terminal 48, a current flowing from the source of the current detecting transistor is input into the control device.

A gate of the transistor 251 is connected to the gate signal output terminal 51. By the connection between the gate of the transistor 251 and the gate signal output terminal 51, a gate signal output from the control device is input into the gate of the transistor 251 via the gate signal output terminal 51.

A source (auxiliary source) of a current detecting transistor (not illustrated) provided in the transistor 251 is connected to the current detection terminal 52. By the connection between the source of the current detecting transistor and the current detection terminal 52, a current flowing from the source of the current detecting transistor is input into the control device.

A gate of the transistor 261 is connected to the gate signal output terminal 53. By the connection between the gate of the transistor 261 and the gate signal output terminal 53, a gate signal output from the control device is input into the gate of the transistor 261 via the gate signal output terminal 53.

A source (auxiliary source) of a current detecting transistor (not illustrated) provided in the transistor 261 is connected to the current detection terminal 54. By the connection between the source of the current detecting transistor and the current detection terminal 54, a current flowing from the current detecting transistor is input into the control device.

A gate of the transistor 271 is connected to the gate signal output terminal 55. By the connection between the gate of the transistor 271 and the gate signal output terminal 55, a gate signal output from the control device is output to the gate of the transistor 271 via the gate signal output terminal 55.

A source (auxiliary source) of a current detecting transistor (not illustrated) provided in the transistor 271 is connected to the current detection terminal 56. By the connection between the source of the current detecting transistor and the current detection terminal 56, a current flowing from the current detecting transistor is input into the control device.

A gate of the transistor 281 is connected to the gate signal output terminal 57. By the connection between the gate of the transistor 281 and the gate signal output terminal 57, a gate signal output from the control device is input into the gate of the transistor 281 via the gate signal output terminal 57.

A source (auxiliary source) of a current detecting transistor (not illustrated) provided in the transistor 281 is connected to the current detection terminal 58. By the connection between the source of the current detecting transistor and the current detection terminal 58, a current flowing from the current detecting transistor is input into the control device.

The gate signal is a pulse-like signal. The same gate signal is input into each of the transistors 211, 221, 231, 241. A potential difference between the low potential level and the high potential level of the gate signals output from the gate signal output terminals 41, 43, 45, 47 becomes a gate-source voltage to be applied to the transistors 211, 221, 231, 241. Therefore, when the potential level of the gate signals output from the gate signal output terminals 41, 43, 45, 47 is a high potential level, the transistors 211, 221, 231, 241 are turned on (conduction state). On the other hand, when the potential level of the gate signals output from the gate signal output terminals 41, 43, 45, 47 is a low potential level, the transistors 211, 221, 231, 241 are turned off (non-conduction state).

The same gate signal is input into each of the transistors 251, 261, 271, 281. A potential difference between the low potential level and the high potential level of the gate signals output from the gate signal output terminals 51, 53, 55, 57 becomes a gate-source voltage to be applied to the transistors 251, 261, 271, 281. Therefore, when the potential level of the gate signals output from the gate signal output terminals 51, 53, 55, 57 is a high potential level, the transistors 251, 261, 271, 281 are turned on (conduction state). On the other hand, when the potential level of the gate signals output from the gate signal output terminals 51, 53, 55, 57 is a low potential level, the transistors 251, 261, 271, 281 are turned off (non-conduction state).

The gate signals output from the gate signal output terminals 41, 43, 45, 47 are signals having polarities opposite to those of the gate signals output from the gate signal output terminals 51, 53, 55, 57. Therefore, the control device controls On/Off of the transistors 211, 221, 231, 241 in a predetermined cycle and controls Off/On of the transistors 251, 261, 271, 281 in the cycle, which enables the U-phase inverter section 12u to convert a DC voltage to be applied between the positive electrode terminal Pu and the negative electrode terminal Nu into an AC voltage and output the AC voltage from the intermediate terminal Mu to the load.

(Method for Manufacturing Semiconductor Module)

Figure 4:
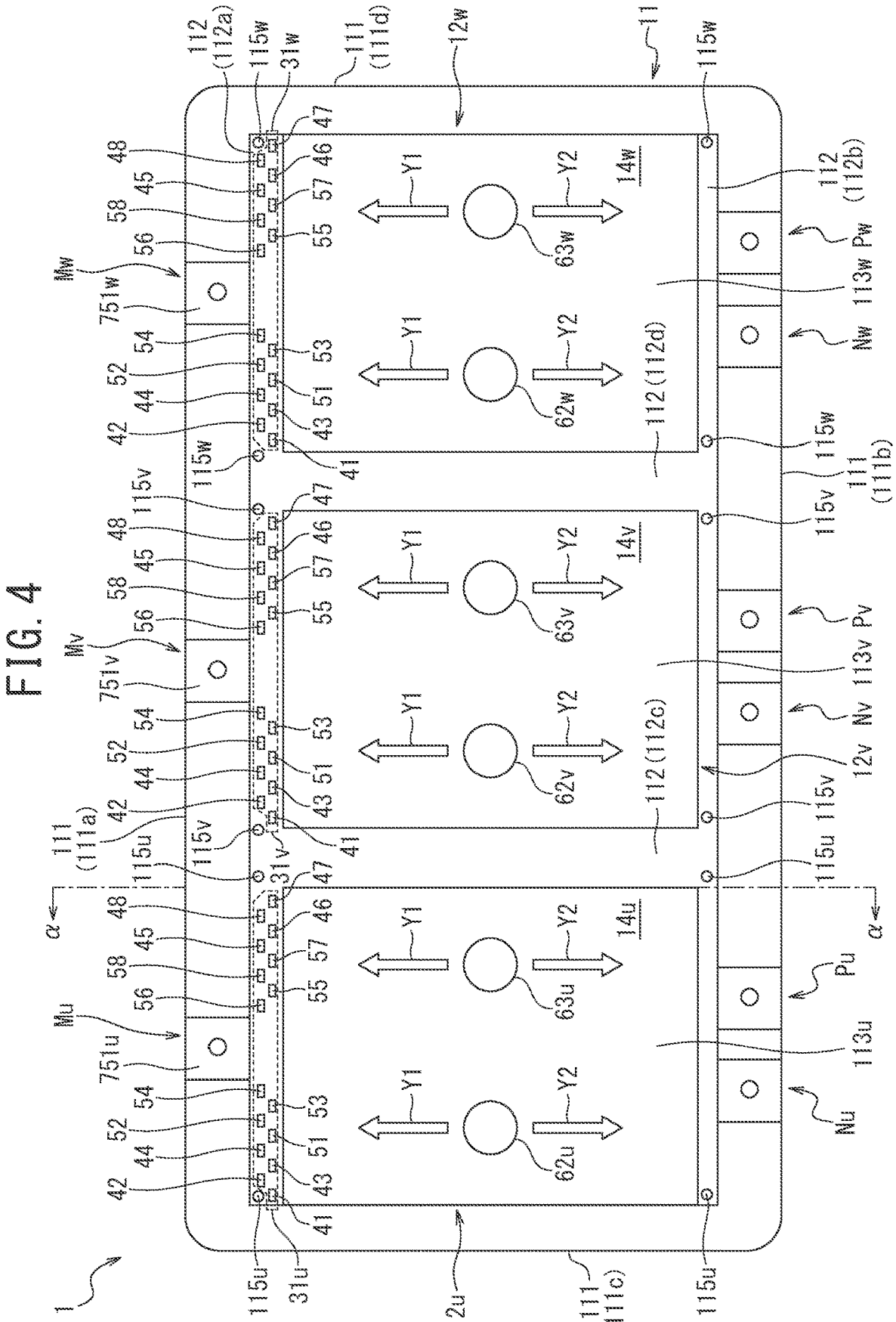
FIG. 4 is a view (No. 1) for explaining a method for manufacturing a semiconductor module according to one embodiment of the present invention.
Figure 5:
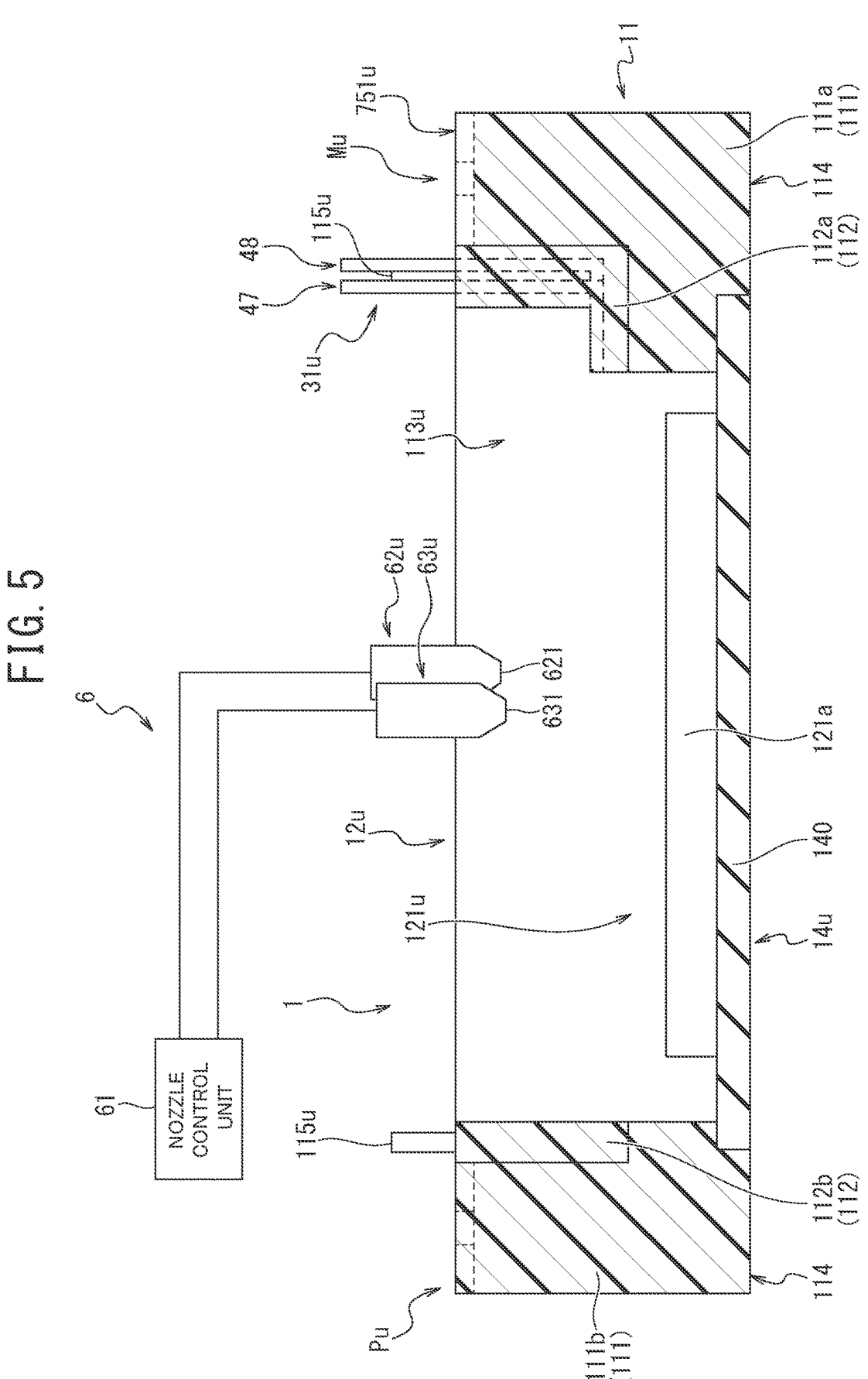
FIG. 5 is a view (No. 2) for explaining the method for manufacturing a semiconductor module according to one embodiment of the present invention.
Figure 6:
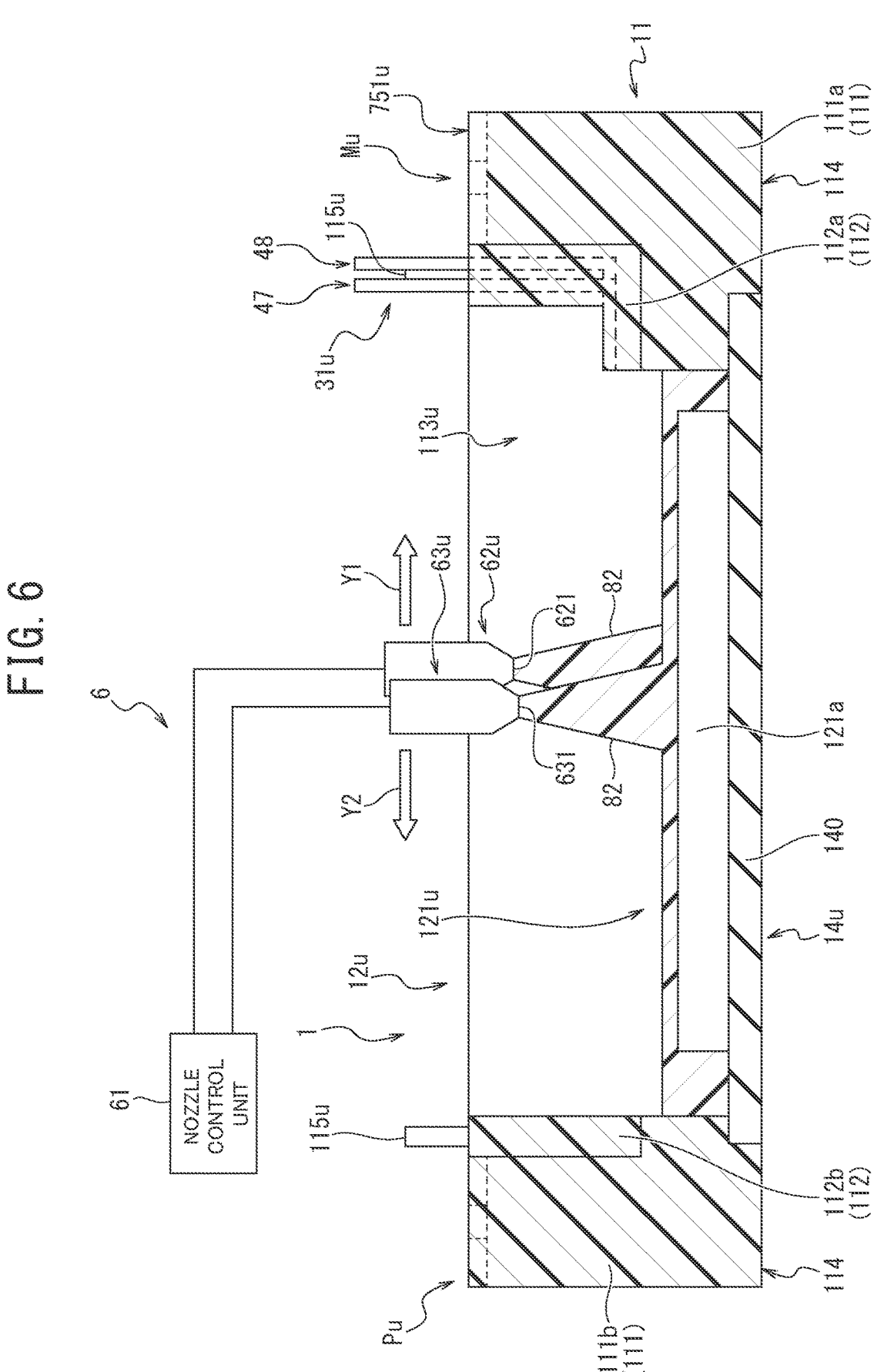
FIG. 6 is a view (No. 3) for explaining the method for manufacturing a semiconductor module according to one embodiment of the present invention.
Figure 7:
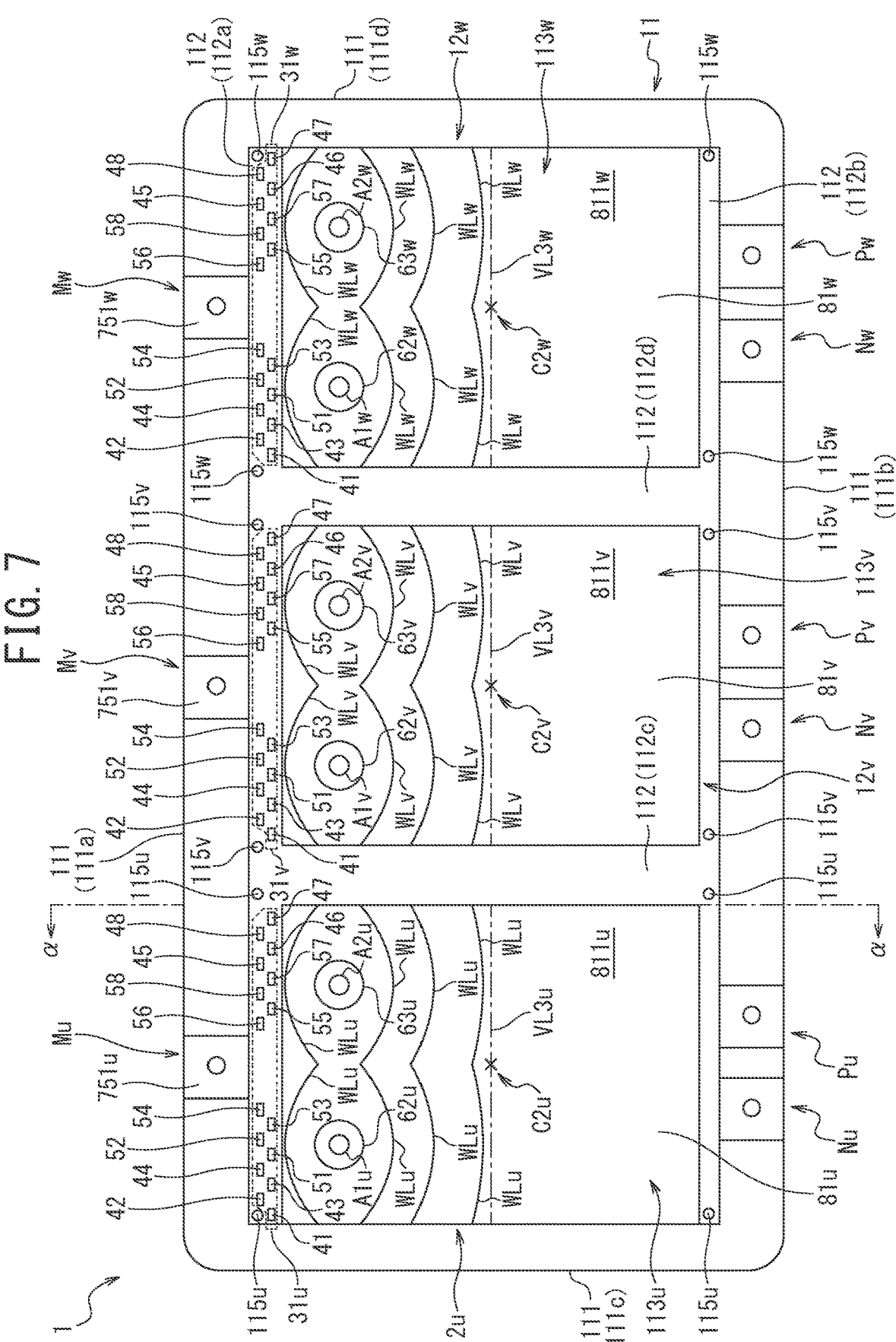
FIG. 7 is a view (No. 4) for explaining the method for manufacturing a semiconductor module according to one embodiment of the present invention.
Figure 8:
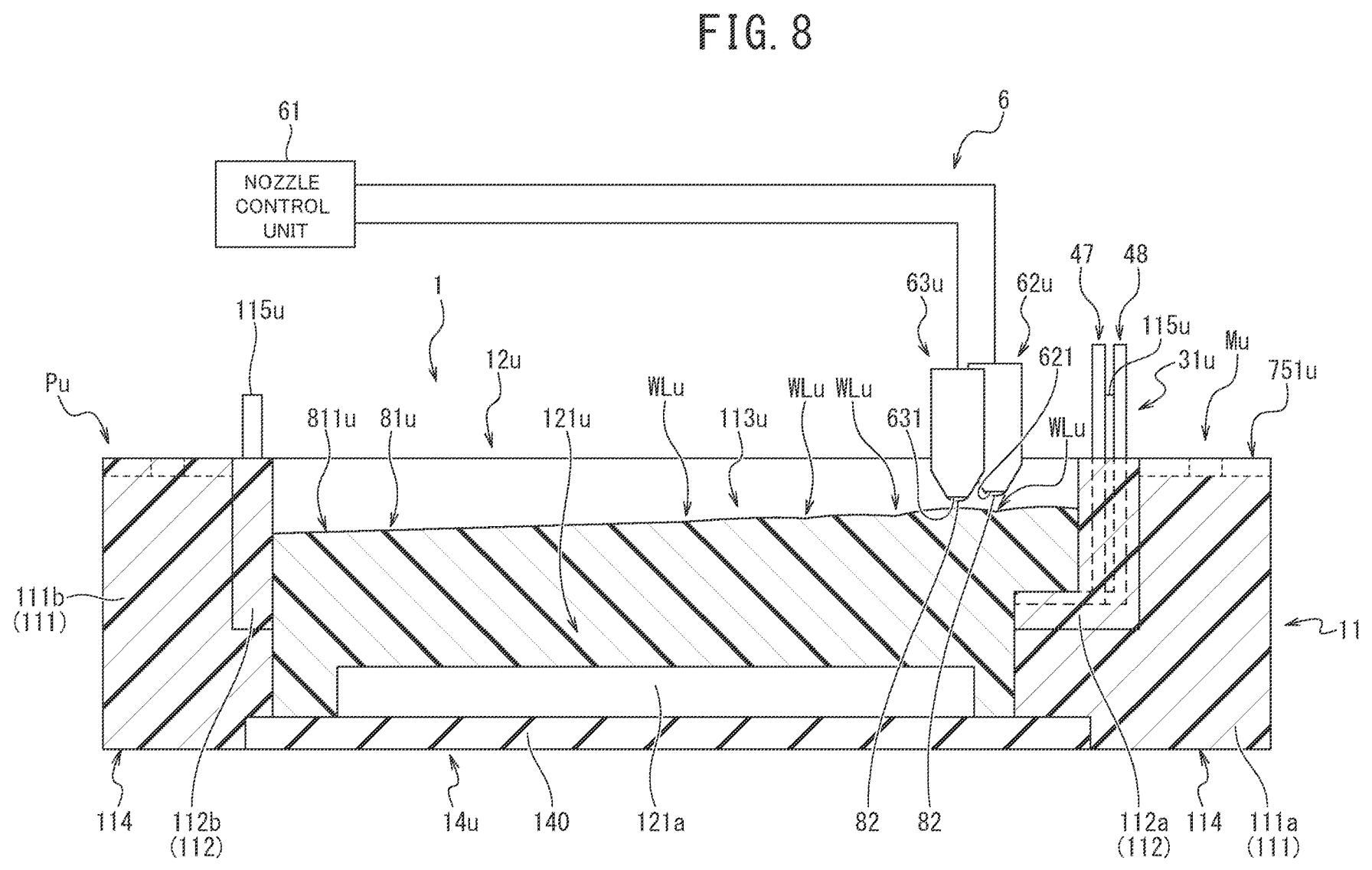

A method for manufacturing a semiconductor module according to this embodiment is described using FIGS. 4 to 8. FIG. 4 is a schematic plan view of the semiconductor module 1 for explaining the method for manufacturing the semiconductor module 1, and is a view for explaining the initial positions and the movement state in the discharge of epoxy resins 82 of nozzles 62u, 63u provided in a casting device 6. FIG. 5 is a cross-sectional view of the semiconductor module 1 cut along the α-α line illustrated in FIG. 4 for explaining the method for manufacturing the semiconductor module 1, and is a view for explaining the initial positions of the nozzles 62u, 63u provided in the casting device 6. FIG. 6 is a cross-sectional view of the semiconductor module 1 cut at a position corresponding to the α-α line illustrated in FIG. 4 for explaining the method for manufacturing the semiconductor module 1, and is a view for explaining the movement state in the discharge of the epoxy resins 82 of the nozzles 62u, 63u provided in the casting device 6. FIG. 7 is a schematic plan view of the semiconductor module 1 for explaining the method for manufacturing the semiconductor module 1, and is a view for explaining the positions where the nozzles 62u, 63u provided in the casting device 6 complete the discharge of the epoxy resins 82 and stop. FIG. 8 is a schematic cross-sectional view of the semiconductor module 1 cut along the α-α line illustrated in FIG. 7 for explaining the method for manufacturing the semiconductor module 1, and is a view for explaining the positions where the nozzles 62u, 63u provided in the casting device 6 complete the discharge of the epoxy resins 82 and stop.

In the method for manufacturing the semiconductor module 1 according to this embodiment, the case 11 to which the gate signal output terminals 41 to 57 and the current detection terminals 42 to 58 for each of the U-phase, the V-phase, and the W-phase are attached is attached, by an adhesive, for example, to a base portion (not illustrated) provided with the DBC substrate 14u and DBC substrates 14v, 14w mounted with the inverter circuits 121u, 121v, 121w, respectively, and the cooling unit. This forms the casting region 113u in which an upper part of the case 11 is opened and which is surrounded by the inner wall 112 of the case 11 and the DBC substrate 14u, the casting region 113v in which an upper part of the case 11 is opened and which is surrounded by the inner wall 112 of the case 11 and the DBC substrate 14v, and the casting region 113w in which an upper part of the case 11 is opened and which is surrounded by the inner wall 112 of the case 11 and the DBC substrate 14w.

In each of the U-phase inverter section 12u, the V-phase inverter section 12v, and the W-phase inverter section 12w, corresponding points among the gate signal output terminals 41 to 57 and the current detection terminals 42 to 58, and the semiconductor elements 21 to 27 are connected by bonding wires. Further, in each of the U-phase inverter section 12u, the V-phase inverter section 12v, and the W-phase inverter section 12w, corresponding points among the positive electrode terminals Pu, Pv, Pw, the negative electrode terminals Nu, Nv, Nw, and the intermediate terminals Mu, Mv, Mw, and the wiring patterns formed on the DBC substrates 14u, 14v, 14w are connected. Thus, the semiconductor module 1 is brought into a state in which parts other than the sealing sections 81u, 81v, 81w and the control device outputting the gate signals are assembled. The semiconductor module 1 in this state is placed in a reduced-pressure environment.

Next, as illustrated in FIGS. 4 and 5, the method for manufacturing the semiconductor module 1 includes arranging the nozzles 62u, 63u provided in the casting device 6 casting the epoxy resins 82 into the casting regions 113u, 113v, 113w at predetermined positions of the casting region 113u from above the case 11. The "above the case 11" is the side where the casting regions 113u, 113v, 113w are opened, i.e., the side opposite to the surface 114, and where the fastening surface 751u, 751v, 751w of the intermediate terminals Mu, Mv, Mw, respectively, are arranged. The two nozzles 62u, 63u are arranged from above the case 11 with a predetermined gap in a direction intersecting the direction in which the pair of long side portions 111a, 111b of the peripheral edge portion 111 constituting the case 11 are arranged. More specifically, as viewed in a direction orthogonal to the fastening surface 751u of the intermediate terminal Mu (i.e., in a plan view), the nozzle 62u is arranged at the center, as the predetermined position, of one region of regions obtained by bisecting the casting region 113u in a direction in which the short side portion 111c of the case 11 and the partition section 112c of the inner wall 112 are arranged. The nozzle 63u is arranged at the center of the other region of the bisected regions as the predetermined position. As illustrated in FIG. 4, the nozzles 62u, 63u are arranged substantially on a line in the direction in which the short side portion 111c of the case 11 and the partition section 112c of the inner wall 112 are arranged, but, in FIG. 5 and FIGS. 6 and 8 described later, the nozzles 62u, 63u are displaced for ease of understanding.

The nozzles 62v, 63v provided in the casting device 6 casting the epoxy resins 82 into the casting regions 113u, 113v, 113w are arranged at the predetermined positions of the casting region 113v from above the case 11. The two nozzles 62v, 63v are arranged from above the case 11 with a predetermined gap in the direction intersecting the direction in which the pair of long side portions 111a, 111b of the peripheral edge portion 111 constituting the case 11 are arranged. More specifically, as viewed in a direction orthogonal to the fastening surface 751v of the intermediate terminal Mv (i.e., in a plan view), the nozzle 62v is arranged at the center, as the predetermined position, of one region of regions obtained by bisecting the casting region 113v in a direction in which the partition section 112c and the partition section 112d of the inner wall 112 of the case 11 are arranged. The nozzle 63v is arranged at the center of the other region of the bisected regions as the predetermined position. The nozzles 62v, 63v are arranged substantially on a line in the direction in which the partition section 112c and the partition section 112d of the inner wall 112 of the case 11 are arranged.

The nozzles 62w, 63w provided in the casting device 6 casting the epoxy resins 82 into the casting regions 113u, 113v, 113w are arranged at the predetermined positions of the casting region 113w from above the case 11. The two nozzles 62w, 63w are arranged from above the case 11 with a predetermined gap in the direction intersecting the direction in which the pair of long side portions 111a, 111b of the peripheral edge portion 111 constituting the case 11 are arranged. More specifically, as viewed in a direction orthogonal to the fastening surface 751w of the intermediate terminal Mw (i.e., in a plan view), the nozzle 62w is arranged at the center, as the predetermined position, of one region of regions obtained by bisecting the casting region 113w in a direction in which the partition section 112d of the inner wall 112 of the case 11 and the short side portion 111d of the peripheral edge portion 111 of the case 11 are arranged. The nozzle 63w is arranged at the center of the other region of the bisected regions as the predetermined position. The nozzles 62w, 63w are arranged substantially on a line in the direction in which the partition section 112d of the inner wall 112 of the case 11 and the short side portion 111d of the peripheral edge portion 111 of the case 11 are arranged.

In this embodiment, the casting device 6 has the two nozzles 62u, 63u, 62v, 63v, and 62w, 63w for each of the U-phase, the V-phase and the W-phase, respectively but may be configured to have two nozzles and sequentially discharge the epoxy resins 82 from the two nozzles into the casting regions 113u, 113v, 113w.

Next, as illustrated in FIG. 6, the epoxy resins 82 are discharged from the nozzles 62u, 63u into the casting region $113u$ while moving the nozzles $62u$, $63u$ in the direction toward and away from the long side portion $111a$ (an example of the one of the pair of long side portions $111a$, $111b$) of the pair of long side portions $111a$, $111b$ of the peripheral edge portion $111$ constituting the case $11$. The two nozzles $62u$, $63u$ operate similarly to each other under the control by a nozzle control unit $61$. Specifically, the nozzle control unit $61$ provided in the casting device $6$ moves the nozzles $62u$, $63u$ in the direction toward the long side portion $111a$ of the peripheral edge portion $111$ while controlling the discharge amounts of the epoxy resins $82$ (not illustrated in FIG. $4$) as illustrated by arrows Y1 in FIGS. $4$ and $6$. When the nozzle control unit $61$ brings the nozzles $62u$, $63u$ close to the long side portion $111a$ of the peripheral edge portion $111$ up to a predetermined distance, the nozzle control unit $61$ then moves the nozzles $62u$, $63u$ in the direction away from the long side portion $111a$ of the peripheral edge portion $111$ while controlling the discharge amounts of the epoxy resins $82$ as illustrated by arrows Y2 in FIGS. $4$ and $6$. Thus, the nozzle control unit $61$ reciprocates the nozzles $62u$, $63u$ a plurality of times in the longitudinal direction of the casting region $113u$, and fills the casting region $113u$ with the epoxy resins $82$.

The epoxy resins $82$ are discharged from the nozzles $62v$, $63v$ into the casting region $113v$ while moving the nozzles $62v$, $63v$ in the direction toward and away from the long side portion $111a$ (an example of the one of the pair of long side portions $111a$, $111b$) of the pair of long side portions $111a$, $111b$ of the peripheral edge portion $111$ constituting the case $11$. The two nozzles $62v$, $63v$ operate similarly to each other under the control by the nozzle control unit $61$. Specifically, the nozzle control unit $61$ provided in the casting device $6$ moves the nozzles $62v$, $63v$ in the direction toward the long side portion $111a$ of the peripheral edge portion $111$ while controlling the discharge amounts of the epoxy resins $82$ as illustrated by arrows Y1 in FIGS. $4$ and $6$. When the nozzle control unit $61$ brings the nozzles $62v$, $63v$ close to the long side portion $111a$ of the peripheral edge portion $111$ up to a predetermined distance, the nozzle control unit $61$ then moves the nozzles $62v$, $63v$ in the direction away from the long side portion $111a$ of the peripheral edge portion $111$ while controlling the discharge amounts of the epoxy resins $82$ as illustrated by arrows Y2 in FIGS. $4$ and $6$. Thus, the nozzle control unit $61$ reciprocates the nozzles $62v$, $63v$ a plurality of times in the longitudinal direction of the casting region $113v$, and fills the casting region $113v$ with the epoxy resins $82$.

The epoxy resins $82$ are discharged from the nozzles $62w$, $63w$ into the casting region $113w$ while moving the nozzles $62w$, $63w$ in the direction toward and away from the long side portion $111a$ (an example of the one of the pair of long side portions $111a$, $111b$) of the pair of long side portions $111a$, $111b$ of the peripheral edge portion $111$ constituting the case $11$. The two nozzles $62w$, $63w$ operate similarly to each other under the control by the nozzle control unit $61$. Specifically, the nozzle control unit $61$ provided in the casting device $6$ moves the nozzles $62w$, $63w$ in the direction toward the long side portion $111a$ of the peripheral edge portion $111$ while controlling the discharge amounts of the epoxy resins $82$ as illustrated by arrows Y1 in FIGS. $4$ and $6$. When the nozzle control unit $61$ brings the nozzles $62w$, $63w$ close to the long side portion $111a$ of the peripheral edge portion $111$ up to a predetermined distance, the nozzle control unit $61$ then moves the nozzles $62w$, $63w$ in the direction away from the long side portion $111a$ of the peripheral edge portion $111$ while controlling the discharge amounts of the epoxy resins $82$ as illustrated by arrows Y2 in FIGS. $4$ and $6$. Thus, the nozzle control unit $61$ reciprocates the nozzles $62w$, $63w$ a plurality of times in the longitudinal direction of the casting region $113w$, and fills the casting region $113w$ with the epoxy resins $82$.

The nozzle control unit $61$ reciprocates the nozzles $62u$, $63u$ a plurality of times (for example, twice) in the longitudinal direction of the casting region $113u$, and then moves the nozzles $62u$, $63u$ in the direction toward the long side portion $111a$ of the peripheral edge portion $111$. As illustrated in FIGS. $7$ and $8$, the nozzle control unit $61$ stops the movement of the nozzles $62u$, $63u$ at positions close to the structure $31u$ side of the casting region $113u$, and stops the discharge of the epoxy resins $82$ into the casting region $113u$ and completes the formation of the sealing section $81u$.

When the casting region $113u$ is viewed from above the case $11$ (i.e., in a plan view), the nozzle control unit $61$ provided in the casting device $6$ stops the movement of the nozzles $62u$, $63u$ in a region of the casting region $113u$ included between a virtual straight line VL$3u$ including a center C$2u$ of the casting region $113u$ in the direction in which the pair of long side portions $111a$, $111b$ of the peripheral edge portion $111$ constituting the case $11$ are arranged and intersecting the direction and the structure $31u$. In a plan view, the center C$2u$ coincides with the center C$1u$ (see FIG. $1$) and the virtual straight line VL$3u$ coincides with the virtual straight line VL$1u$ (see FIG. $1$).

The position where the nozzle $62u$ stops is a position above the region A$1u$. The position where the nozzle $63u$ stops is a position above the region A$2u$. Therefore, in the step of forming the sealing section $81u$, the epoxy resin $82$ is finally discharged from the nozzle $62u$ into the casting region $113u$ at the position corresponding to the region A$1u$ during the formation of the sealing section $81u$. The number of times in which the nozzles $62u$, $63u$ move to enter is larger in the region of the casting region $113u$ included between the virtual straight line VL$3u$ and the structure $31u$ than in the region of the casting region $113u$ included between the virtual straight line VL$3u$ and the long side portion $112b$ of the inner wall $112$. Therefore, the discharge amounts of the epoxy resins $82$ are larger in the region of the casting region $113u$ included between the virtual straight line VL$3u$ and the structure $31u$ than in the region of the casting region $113u$ included between the virtual straight line VL$3u$ and the long side portion $112b$ of the inner wall $112$. Thus, in the sealing section $81u$ finally formed in the casting region $113u$, the thickness of the region of the casting region $113u$ included between the virtual straight line VL$3u$ and the structure $31u$ is larger than the thickness of the region of the casting region $113u$ included between the virtual straight line VL$3u$ and the long side portion $112b$ of the inner wall $112$ as illustrated in FIG. $8$. Further, in the surface $811u$ of the sealing section $81u$ finally formed in the casting region $113u$, the weld lines WLu concentrically spreading around the regions A$1u$, A$2u$ as the centers are generated close to the structure $31u$ as illustrated in FIG. $7$.

The nozzle control unit $61$ reciprocates the nozzles $62v$, $63v$ a plurality of times (for example, twice) in the longitudinal direction of the casting region $113v$, and then moves the nozzles $62v$, $63v$ toward the long side portion $111a$ of the peripheral edge portion $111$. As illustrated in FIG. $7$, the nozzle control unit $61$ stops the movement of the nozzles $62v$, $63v$ at positions close to the structure $31v$ side of the casting region $113v$, and stops the discharge of the epoxy resins $82$ into the casting region $113v$ and completes the formation of the sealing section $81v$.

When the casting region $113v$ is viewed from above the case $11$ (i.e., in a plan view), the nozzle control unit $61$ provided in the casting device 6 stops the movement of the nozzles 62v, 63v in a region of the casting region 113v included between a virtual straight line VL3v including a center C2v of the casting region 113v in the direction in which the pair of long side portions 111a, 111b of the peripheral edge portion 111 constituting the case 11 are arranged and intersecting the direction and the structure 31v. In a plan view, the center C2v coincides with the center C1v (see FIG. 1) and the virtual straight line VL3v coincides with the virtual straight line VL1v (see FIG. 1).

The position where the nozzle 62v stops is a position above the region A1v. The position where the nozzle 63v stops is a position above the region A2v. Therefore, in the step of forming the sealing section 81v, the epoxy resin 82 is finally discharged from the nozzle 62v into the casting region 113v at the position corresponding to the region A1v during the formation of the sealing section 81v. The number of times in which the nozzles 62v, 63v move to enter is larger in the region of the casting region 113v included between the virtual straight line VL3v and the structure 31v than in the region of the casting region 113v included between the virtual straight line VL3v and the long side portion 112b of the inner wall 112. Therefore, the discharge amounts of the epoxy resins 82 are larger in the region of the casting region 113v included between the virtual straight line VL3v and the structure 31v than in the region of the casting region 113v included between the virtual straight line VL3v and the long side portion 112b of the inner wall 112. Thus, in the sealing section 81v finally formed in the casting region 113v, the thickness of the region of the casting region 113v included between the virtual straight line VL3v and the structure 31v is larger than the thickness of the region of the casting region 113v included between the virtual straight line VL3v and the long side portion 112b of the inner wall 112. Further, in the surface 811v of the sealing section 81v finally formed in the casting region 113v, the weld lines WLv concentrically spreading with the regions A1v, A2v as the centers are generated close to the structure 31v as illustrated in FIG. 7.

The nozzle control unit 61 reciprocates the nozzles 62w, 63w a plurality of times (for example, twice) in the longitudinal direction of the casting region 113w, and then moves the nozzles 62w, 63w toward the long side portion 111a of the peripheral edge portion 111. As illustrated in FIG. 7, the nozzle control unit 61 stops the movement of the nozzles 62w, 63w at positions close to the structure 31w side of the casting region 113w, and stops the discharge of the epoxy resins 82 into the casting region 113w and completes the formation of the sealing section 81w.

When the casting region 113w is viewed from above the case 11 (i.e., in a plan view), the nozzle control unit 61 provided in the casting device 6 stops the movement of the nozzles 62w, 63w in a region of the casting region 113w included between a virtual straight line VL3w including a center C2w of the casting region 113w in the direction in which the pair of long side portions 111a, 111b of the peripheral edge portion 111 constituting the case 11 are arranged and intersecting the direction and the structure 31w. In a plan view, the center C2w coincides with the center C1w (see FIG. 1) and the virtual straight line VL3w coincides with the virtual straight line VL1w (see FIG. 1).

The position where the nozzle 62w stops is a position above the region A1w. The position where the nozzle 63w stops is a position above the region A2w. Therefore, in the step of forming the sealing section 81w, the epoxy resin 82 is finally discharged from the nozzle 62w into the casting region 113w at the position corresponding to the region A1w during the formation of the sealing section 81w. The number of times in which the nozzles 62w, 63w move to enter is larger in the region of the casting region 113w included between the virtual straight line VL3w and the structure 31w than in the region of the casting region 113w included between the virtual straight line VL3w and the long side portion 112b of the inner wall 112. Therefore, the discharge amounts of the epoxy resins 82 are larger in the region of the casting region 113w included between the virtual straight line VL3w and the structure 31w than in the region of the casting region 113w included between the virtual straight line VL3w and the long side portion 112b of the inner wall 112. Thus, in the sealing section 81w finally formed in the casting region 113w, the thickness of the region of the casting region 113w included between the virtual straight line VL3w and the structure 31w is larger than the thickness of the region of the casting region 113w included between the virtual straight line VL3w and the long side portion 112b of the inner wall 112. Further, in the surface 811w of the sealing section 81w finally formed in the casting region 113w, the weld lines WLw concentrically spreading with the regions A1w, A2w as the centers are generated close to the structure 31w as illustrated in FIG. 7.

When the casting of the epoxy resins 82 into the casting regions 113u, 113v, 113w is completed, the nozzle control unit 61 provided in the casting device 6 retracts the nozzles 62u, 63u, 63v, 63v, 62w, 63w from above the case 11. Thereafter, the control device is attached to the case 11, and the epoxy resins 82 cast into the casting regions 113u, 113v, 113w are cured to form the sealing sections 81u, 81v, 81w, so that the semiconductor module 1 is completed.

(Effects of Semiconductor Module and Method for Manufacturing Semiconductor Module)

The effects of the semiconductor module and the method for manufacturing a semiconductor module according to this embodiment are described using FIG. 9 referring to FIGS. 5 and 7. In this embodiment, the effects in the U-phase inverter section 12u, the V-phase inverter section 12v, and the W-phase inverter section 12w are the same. Therefore, hereinafter, the effects of the semiconductor module 1 and the method for manufacturing the semiconductor module 1 are described taking the U-phase inverter section 12u as an example. FIG. 9 is a view for explaining the effects of the semiconductor module 1 and the method for manufacturing the semiconductor module 1 according to this embodiment, in which the nozzles 62u, 63u in the state where the casting of the epoxy resins 82 is completed are also illustrated in the schematic cross-sectional view of the semiconductor module 1 cut along the α-α line illustrated in FIG. 7.

When an epoxy resin is cast into a casting region, an unexpected bubble is sometimes generated in the epoxy resin. The casting, i.e., sealing, of the epoxy resin is carried out under reduced pressure. Therefore, when the epoxy resin is cast, droplets of resin materials formed by the breakage of the bubble are sometimes scattered far away such that the droplets reach a peripheral edge portion of a case with a place where the bubble is broken as the starting point.

As illustrated in FIG. 9, the semiconductor module 1 includes the structure 31u. The structure 31u is arranged between the nozzles 62u, 63u and the fastening surface 751u of the intermediate terminal Mu. The structure 31u has the gate signal output terminals 41 to 57 and the current detection terminals 42 to 58. Portions projecting from the long side portion 112a of the inner wall 112 of the gate signal output terminals 41 to 57 and the current detection terminals 42 to 58 are higher than a discharge port 621 of the nozzle 62u, a discharge port 631 of the nozzle 63u, and the fastening surface 751u of the intermediate terminal Mu with the surface 114 of the case 11 as a reference. Therefore, when viewed from the sides of the nozzles 62u, 63u, the structure 31u is arranged to shield the fastening surface 751u of the intermediate terminal Mu by the gate signal output terminals 41 to 57 and the current detection terminals 42 to 58.

As illustrated in FIG. 9, the nozzles 62u, 63u stop at positions where the discharge ports 621, 631 of the epoxy resins 82 of the nozzles 62u, 63u, respectively, at the time when the discharge of the epoxy resin 82 is completed, are lower than the structure 31u. The epoxy resins 82 remain in the discharge port 621 of the nozzle 62u and the discharge port 631 of the nozzle 63u at the time when the discharge of the epoxy resins 82 is completed.

The semiconductor module 1 includes the structure 31u having the gate signal output terminals 41 to 57 and the current detection terminals 42 to 58 arranged to shield the fastening surface 751u of the intermediate terminal Mu. As illustrated in FIG. 7, the gate signal output terminals 41 to 57 and the current detection terminals 42 to 58 are arranged in a plurality of rows in the direction in which the pair of long side portions 111a, 111b of the peripheral edge portion 111 constituting the case 11 are arranged and each have a surface having a predetermined spread when viewed in the direction in which the pair of long side portions 111a, 111b are arranged. Therefore, even when bubbles are generated in the epoxy resins 82 remaining in the discharge port 621 of the nozzle 62u and the discharge port 631 of the nozzle 63u, and the generated bubbles are broken and droplets DR are scattered toward the intermediate terminal Mu, the droplets DR adhere to at least one of the surfaces of the gate signal output terminals 41 to 57 and the current detection terminals 42 to 58 as illustrated in FIG. 9.

When viewed in the direction in which the pair of long side portions 111a, 111b are arranged, the adjacent terminals among the gate signal output terminals 41 to 57 and the current detection terminals 42 to 58 are arranged not to overlap each other and are arranged at intervals of 0.5 mm or less, for example.

Between the gate signal output terminals 41 to 57 and the current detection terminals 42 to 58, and the intermediate terminal Mu, conductive substances, such as terminals having a workload larger than that of the gate signal output terminals 41 to 57 and the current detection terminals 42 to 58, are not present. The droplets DR have a property of being drawn to the conductive substances. Therefore, even when the gate signal output terminals 41 to 57 and the current detection terminals 42 to 58 are arranged such that the terminals, which are adjacent to each other when viewed in the direction in which the pair of long side portions 111a, 111b are arranged (i.e., a direction in which the droplets DR move toward the intermediate terminal Mu side), are arranged at intervals, the droplets DR are drawn to any of the gate signal output terminals 41 to 57 and the current detection terminals 42 to 58 and adhere to the surfaces of the drawn terminals.

Further, even when the droplet DR flies beyond the gate signal output terminals 41 to 57 and the current detection terminals 42 to 58 toward the intermediate terminal Mu side, problems do not occur in a case where the droplet DR reaches not the fastening surface 751u of the intermediate terminal Mu but the outside of the case 11. As illustrated in FIG. 9, a distance parallel to the fastening surface 751u of the intermediate terminal Mu from the structure 31u to the outer peripheral end of the case 11 is defined as D1. A distance parallel to the fastening surface 751u of the intermediate terminal Mu from the virtual straight line VL3u (see FIG. 7) including the center C2u (see FIG. 7) of the casting region 113u to the structure 31u is defined as D2.

As illustrated in FIG. 9, it is assumed that the nozzles 62u, 63u stop within the range of a distance D3 in which the distance from the structure 31u to the casting region 113u is equal to the distance D1. In this case, the droplets DR collide with the structure 31u or the inner wall 112 regardless of the magnitude of the energy generated when the bubbles generated in the epoxy resins 82 remaining in the discharge ports 621, 631 of the nozzles 62u, 63u, respectively, are broken, and therefore the droplets DR do not adhere to the fastening surface 751u of the terminal Mu.

Alternatively, it is assumed that the nozzles 62u, 63u stop within a distance D4 in which the distance from the structure 31u to the casting region 113u is longer than the distance D3 and is equal to or less than the length up to the center C2u. In this case, when the energy generated when the bubbles generated in the epoxy resins 82 remaining in the discharge ports 621, 631 of the nozzles 62u, 63u, respectively, are broken is small, the droplets DR collide with the structure 31u or the inner wall 112, and therefore do not adhere to the fastening surface 751u of the intermediate terminal Mu.

On the other hand, when the nozzles 62u, 63u stop within the range of the distance D4 and the energy generated when the bubbles generated in the epoxy resins 82 remaining in the discharge ports 621, 631 of the nozzles 62u, 63u, respectively, are broken is large, the droplet DR flies beyond the intermediate terminal Mu and reaches the outside of the case 11, and therefore do not adhere to the fastening surface 751u of the intermediate terminal Mu.

Further, it is assumed that the nozzles 62u, 63u stop in the range where the distance from the structure 31u to the casting region 113u is longer than the distance D2. In this case, the droplets DR collide with the structure 31u or the inner wall 112 or do not reach the structure 31u or the inner wall 112 regardless of the magnitude of the energy generated when the bubbles generated in the epoxy resins 82 remaining in the discharge ports 621, 631 of the nozzles 62u, 63u, respectively, are broken, and therefore the droplets DR do not adhere to the fastening surface 751u of the intermediate terminal Mu.

Thus, in the manufacture of the semiconductor module 1, the droplets DR can be prevented from reaching the fastening surface 751u of the intermediate terminal Mu. As a result, the semiconductor module 1 can prevent an increase in contact resistance between the fastening surface 751u of the intermediate terminal Mu and a cable, and therefore can prevent the heat generation in the intermediate terminal Mu and can cause a desired current to flow to the load from the U-phase inverter section 12u. Further, the semiconductor module 1 prevents the adhesion of the droplets DR to the fastening surface 751u of the intermediate terminal Mu, and therefore is free from a problem that a worker who fastens the cable to the intermediate terminal Mu fastens the cable to the intermediate terminal Mu without noticing the droplets DR.

The semiconductor module 1 includes the structure 31v having the same configuration as that of the structure 31u in the V-phase inverter section 12v and the structure 31w having the same configuration as that of the structure 31u in the W-phase inverter section 12w, as with the U-phase inverter section 12u. Further, in the manufacture of the semiconductor module 1, the movement of the nozzles 62v, 63v (see FIG. 7) is stopped at the positions close to the structure 31v side of the casting region 113v (i.e., within the range of distance D2), and the discharge of the epoxy resins 82 into the casting region 113v is stopped. Similarly, in the manufacture of the semiconductor module 1, the movement of the nozzles 62w, 63w (see FIG. 7) is stopped at the positions close to the structure 31w side of the casting region 113w (i.e., within the range of distance D2), and the discharge of the epoxy resins 82 into the casting region 113w is stopped. Thus, the semiconductor module 1 can prevent the adhesion of the droplets DR to the intermediate terminals Mv, Mw, and therefore can prevent the heat generation in the intermediate terminals Mv, Mw and can cause a desired current to flow to the load from each of the V-phase inverter section 12v and the W-phase inverter section 12w, respectively. Further, the semiconductor module 1 is free from a problem that a worker who fastens the cable to the intermediate terminals Mv, Mw fastens cables to the intermediate terminals Mv, Mw without noticing the droplets DR.

To the gate signal output terminals 41 to 57 and the current detection terminals 42 to 58, a current smaller than the current flowing to the intermediate terminals Mu, Mv, Mw flows, and a voltage lower than the voltage applied to the intermediate terminals Mu, Mv, Mw is applied. Therefore, even when the droplets DR adhere to the gate signal output terminals 41 to 57 and the current detection terminals 42 to 58, problems, such as the heat generation and the inability to transmit desired gate signals and to the transistors 211 to 281 and the inability to input currents flowing from the current detecting transistors to the control device, do not occur.

As described above, the semiconductor module 1 according to this embodiment includes: the case 11 having the inner wall 112 defining the casting regions 113u, 113v, 113w where the transistors 211 to 281 are arranged and the peripheral edge portion 111 arranged outside the inner wall 112 and formed in a rectangular annular shape; the intermediate terminals Mu, Mv, Mw arranged in the long side portion 111a of the pair of long side portions 111a, 111b forming a part of the peripheral edge portion 111 and facing each other, having the fastening surfaces 751u, 751v, 751w, respectively, to which a cable connected to a load as a drive target is fastened, and connected to the transistors 211 to 281; the structures 31u, 31v, 31w arranged in the long side portion 112a of the inner wall 112 to be adjacent to the long side portion 111a where the intermediate terminals Mu, Mv, Mw are arranged and higher than the fastening surfaces 751u, 751v, 751w, respectively; and the sealing sections 81u, 81v, 81w made of the epoxy resins 82, having the weld lines WLu, WLv, WLw formed close to the sides of the structures 31u, 31v, 31w on the surfaces 811u, 811v, 811w, and cast into the casting regions 113u, 113v, 113w, respectively, to seal the transistors 211 to 281.

The method for manufacturing the semiconductor module 1 according to this embodiment is a method for manufacturing a semiconductor module, the semiconductor module being the semiconductor module 1 according to this embodiment, and the method includes: arranging the nozzles 62u, 63u, 62v, 63v, 62w, 63w provided in the casting device 6 casting the epoxy resins 82 into the casting regions 113u, 113v, 113w at the predetermined positions of the casting regions 113u, 113v, 113w, respectively, from above the case 11; discharging the epoxy resins 82 from the nozzles 62u, 63u, 62v, 63v, 62w, 63w into the casting regions 113u, 113v, 113w while moving the nozzles 62u, 63u, 62v, 63v, 62w, 63w in the direction toward and away from the long side portion 111a of the pair of long side portions 111a, 111b of the peripheral edge portion 111; stopping the movement of the nozzles 62u, 63u, 62v, 63v, 62w, 63w at the positions close to the sides of the structures 31u, 31v, 31w of the casting regions 113u, 113v, 113w (regions A1u, A2u, A1v, A2v, A1w, A2w), respectively; and stopping the discharge of the epoxy resins 82 into the casting regions 113u, 113v, 113w and completing the formation of the sealing sections 81u, 81v, 81w, respectively.

This enables the semiconductor module 1 to prevent the adhesion of an epoxy resin to terminals to which at least one of a large current and a high voltage is supplied.

The present invention can be variously modified without being limited to the embodiment described above.

The semiconductor module according to the embodiment described above has the structures having the gate signal output terminals and the current detection terminals, but the present invention is not limited thereto. The structure may have configurations other than the gate signal output terminals and the current detection terminals insofar as the structure is arranged between the sealing section and the intermediate terminal. For example, even when the structure has a long side portion of an inner wall formed higher than a fastening surface of an intermediate terminal, the same effects as those of the semiconductor module according to the embodiment described above can be obtained.

In the method for manufacturing a semiconductor module according to the embodiment described above, two nozzles are used for each casting region, but the present invention is not limited thereto. For example, one or three or more nozzles may be used for each casting region.

In the embodiment described above, the transistor provided in each of the semiconductor elements are configured by a MOSFET but may be configured by an insulated gate bipolar transistor (IGBT).

In the embodiment described above, the gate signal output terminals and the current detection terminals are arranged in two rows, but may be arranged in one row or three or more rows.

In the embodiment described above, the gate signal output terminals and the current detection terminals each have a surface having a predetermined spread toward the casting regions, but may be press-fit terminals having a through hole in the surface.

The semiconductor module according to the embodiment described above has the inner wall constituting the case having substantially the same height as that of the fastening surface of each of the positive electrode terminals and the negative electrode terminals, but the present invention is not limited thereto. The inner wall constituting the case may have a height higher than the fastening surface of each of the positive electrode terminals and the negative electrode terminals. This enables the semiconductor module to prevent the adhesion of droplets to the fastening surfaces of the positive electrode terminals and the negative electrode terminals in manufacturing.

The technical scope of the present invention is not limited to the illustrated and described exemplary embodiment, and also includes all embodiments that provide effects equivalent to the effects intended by the present invention. Further, the technical scope of the present invention is not limited to combinations of the features of the invention defined by claims, and can be defined by any desired combination of specific features among all the disclosed features.

REFERENCE SIGNS LIST 1 semiconductor module
6 casting device
11 case
12u U-phase inverter section
12v V-phase inverter section 12w W-phase inverter section
14u, 14v, 14w DBC substrate
21, 22, 23, 24, 25, 26, 27, 28 semiconductor element
31u, 31v, 31w structure
41, 43, 45, 47, 51, 53, 55, 57 gate signal output terminal
42, 44, 46, 48, 52, 54, 56, 58 current detection terminal
61 nozzle control unit
62u, 62v, 62w, 63u, 63v, 63w nozzle
81u, 81v, 81w sealing section
82 epoxy resin
111 peripheral edge portion
111a, 111b, 112a, 112b long side portion
111c, 111d short side portion
112 inner wall
112c, 112d partition section
113u, 113v, 113w casting region
114, 811u, 811v, 811w surface
115u, 115v, 115w fixation section
121a presence region
121u, 121v, 121w inverter circuit
140 insulating substrate
211, 221, 231, 241, 251, 261, 271, 281 transistor
212, 222, 232, 242, 252, 262, 272, 282 freewheel diode
621,631 discharge port
751u, 751v, 751w fastening surface
A1u, A1v, A1w, A2u, A2v, A2w region
C1u, C1v, C1w, C2u, C2v, C2w center
D1, D2, D3, D4 distance
DR droplet
Mu, Mv, Mw intermediate terminal
Nu, Nv, Nw negative electrode terminal
Pu, Pv, Pw positive electrode terminal
Ulo, Vlo, Wlo lower arm
Uup, Vup, Wup upper arm
VL1u, VL1v, VL1w, VL2u, VL2v, VL2w, VL3u, VL3v, VL3w virtual straight line
WLu, WLv, WLw weld line
Y1, Y2 arrow

The invention claimed is:

1. A semiconductor module comprising:
a case having an inner wall defining a space where a plurality of switching elements are arranged and a peripheral edge portion outside the inner wall and having a rectangular annular shape;
a pair of long side portions forming a part of the peripheral edge portion and facing each other, the pair of long side portions including a first long side portion having an intermediate terminal connected to the plurality of switching elements, and the intermediate terminal including a fastening surface to which a cable connected to a load as a drive target is fastenable;
a structure in a partial region of the inner wall adjacent to the first long side portion and extended above the fastening surface; and
a sealing section including an epoxy resin in the space and configured to seal the plurality of switching elements in the space, the sealing section having weld lines on an upper surface of the sealing section and that are closer to the first long side portion than to a second long side portion of the pair of long side portions so as to be on a side of the space adjacent to the structure.

2. The semiconductor module according to claim 1, wherein the weld lines are in a region of the upper surface between the first long side portion and a virtual straight line extending through a center point of the sealing section in a direction parallel to a longitudinal direction of, and between.

3. The semiconductor module according to claim 2, wherein at least parts of the weld lines have a linearly symmetrical shape about a virtual straight line extending through the center point of the sealing section in a direction perpendicular to the longitudinal direction of the pair of long side portions.

4. The semiconductor module according to claim 1, wherein at least parts of the weld lines have a circular shape.

5. The semiconductor module according to claim 2, wherein at least parts of the weld lines have a circular shape.

6. The semiconductor module according to claim 3, wherein at least parts of the weld lines have a circular shape.

7. The semiconductor module according to claim 1, wherein a height of the sealing section decreases from the first long side portion to the second long side portion of the pair of long side portions.

8. The semiconductor module according to claim 2, wherein heights respectively corresponding to the weld lines decrease from the first long side portion to the second long side portion of the pair of long side portions.

9. The semiconductor module according to claim 1, wherein the structure includes current detection terminals and gate signal output terminals.

10. The semiconductor module according to claim 9, wherein the current detection terminals and the gate signal output terminals are interspersed in two rows and the two rows are between the sealing section and the intermediate terminal.

11. The semiconductor module according to claim 1, wherein the structure is configured so that, while the epoxy resin is being discharged into the space or while the epoxy resin is stopping from being discharged into the space, the structure blocks droplets of the epoxy resin from reaching the fastening surface.

12. A method of manufacturing the semiconductor module according to claim 1, the method comprising:
arranging a nozzle of a casting device, configured to cast the epoxy resin into the space, at a position between the first long side portion and the second long side portion of the pair of long side portions;
discharging the epoxy resin from the nozzle into the space while moving the nozzle in a first direction toward the first long side portion and in a second direction away from the first long side portion;
stopping the moving of the nozzle at a position closer to the first long side portion than to the second long side portion; and
stopping the discharging of the epoxy resin into the space; and
curing the epoxy resin to form the sealing section.

13. The method of manufacturing the semiconductor module according to claim 12, wherein
the stopping the moving includes, when the space is viewed from above the case, stopping the moving of the nozzle in a region of the space between the first long side portion and a virtual straight line extending through a center point of the space in a direction parallel to a longitudinal direction of, and between, the pair of long side portions.

14. The method of manufacturing the semiconductor module according to claim 12, wherein
the nozzle includes two nozzles that have a gap between the two nozzles in a direction parallel to a longitudinal direction of the pair of long side portions, and
the arranging includes arranging the two nozzles at the position between the first long side portion and the second long side portion, the discharging includes discharging the epoxy resin from the two nozzles into the space while moving the two nozzles in the first direction and in the second direction, the stopping the moving includes stopping the moving of the two nozzles at a position closer to the first long side portion than to the second long side portion.

15. A method of manufacturing the semiconductor module according to claim 2, the method comprising:

arranging a nozzle of a casting device, configured to cast the epoxy resin into the space, at a position between the first long side portion and the second long side portion of the pair of long side portions;

discharging the epoxy resin from the nozzle into the space while moving the nozzle in a first direction toward the first long side portion and in a second direction away from the first long side portion;

stopping the moving of the nozzle at a position closer to the first long side portion than to the second long side portion; and stopping the discharging of the epoxy resin into the space; and curing the epoxy resin to form the sealing section.

16. A method of manufacturing the semiconductor module according to claim 3, the method comprising:

arranging a nozzle of a casting device, configured to cast the epoxy resin into the space, at a position between the first long side portion and the second long side portion of the pair of long side portions;

discharging the epoxy resin from the nozzle into the space while moving the nozzle in a first direction toward the first long side portion and in a second direction away from the first long side portion;

stopping the moving of the nozzle at a position closer to the first long side portion than to the second long side portion; and stopping the discharging of the epoxy resin into the space; and curing the epoxy resin to form the sealing section.

17. A method of manufacturing the semiconductor module according to claim 4, the method comprising:

arranging a nozzle of a casting device, configured to cast the epoxy resin into the space, at a position between the first long side portion and the second long side portion of the pair of long side portions;

discharging the epoxy resin from the nozzle into the space while moving the nozzle in a first direction toward the first long side portion and in a second direction away from the first long side portion;

stopping the moving of the nozzle at a position closer to the first long side portion than to the second long side portion; and stopping the discharging of the epoxy resin into the space; and curing the epoxy resin to form the sealing section.

18. The method of manufacturing the semiconductor module according to claim 13, wherein the nozzle includes two nozzles that have a gap between the two nozzles in a direction parallel to a longitudinal direction of the pair of long side portions, and the arranging includes arranging the two nozzles at the position closer to the second long side portion than to the first long side portion, the discharging includes discharging the epoxy resin from the two nozzles into the space while moving the two nozzles in a direction toward the first long side portion and away from the second long side portion, the stopping the moving includes stopping the moving of the two nozzles at a position closer to the first long side portion than to the second long side portion.

\* \* \* \* \*